US012640215B2

(12) United States Patent
Wu et al.

(10) Patent No.: US 12,640,215 B2
(45) Date of Patent: May 26, 2026

(54) MEMORY DEVICES WITH STACKING CIRCUITS AND METHODS OF OPERATING THEREOF

(71) Applicant: Taiwan Semiconductor Manufacturing Company, Ltd., Hsinchu (TW)

(72) Inventors: Min-Shin Wu, Hsinchu (TW); Meng-Sheng Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 134 days.

(21) Appl. No.: 18/405,953

(22) Filed: Jan. 5, 2024

(65) Prior Publication Data

US 2025/0087287 A1     Mar. 13, 2025

Related U.S. Application Data

(60) Provisional application No. 63/611,999, filed on Dec. 19, 2023, provisional application No. 63/582,384, filed on Sep. 13, 2023.

(51) Int. Cl.
| | |
|---|---|
| *G11C 17/18* | (2006.01) |
| *G11C 11/4074* | (2006.01) |
| *G11C 11/408* | (2006.01) |
| *G11C 11/4094* | (2006.01) |
| *G11C 17/16* | (2006.01) |

(52) U.S. Cl.
CPC .......... *G11C 17/18* (2013.01); *G11C 11/4074* (2013.01); *G11C 11/4085* (2013.01); *G11C 11/4094* (2013.01); *G11C 17/16* (2013.01)

(58) Field of Classification Search
CPC ...................................................... G11C 17/18
See application file for complete search history.

(56) References Cited

U.S. PATENT DOCUMENTS

| | | | |
|---|---|---|---|
| 10,164,524 B1 | 12/2018 | Kumar et al. | |
| 11,200,030 B2 | 12/2021 | Khanna et al. | |
| 11,418,195 B1 * | 8/2022 | Hunt-Schroeder | .... H03K 3/037 |
| 2002/0191438 A1 * | 12/2002 | Shukuri | ................. G11C 29/70 |
| | | | 365/185.05 |
| 2008/0068910 A1 * | 3/2008 | Jao | ........................... G11C 7/20 |
| | | | 365/206 |

(Continued)

FOREIGN PATENT DOCUMENTS

| | | |
|---|---|---|
| KR | 102482147 B1 | 12/2022 |
| TW | I483253 B | 5/2015 |
| TW | I797743 B | 4/2023 |

*Primary Examiner* — Douglas King
(74) *Attorney, Agent, or Firm* — Foley & Lardner LLP

(57) ABSTRACT

A memory circuit may comprise a memory array comprising a plurality of memory cells, an input/output (I/O) circuit, and a power management circuit. The I/O circuit can be operatively coupled to the memory array and configured to read or write each of the memory cells. The power management circuit can be operatively coupled to the memory array and the I/O circuit. The power management circuit can be configured to provide a first gate control signal and a second gate control signal based on a received first supply voltage and a received second supply voltage. The first supply voltage can be substantially higher than two times the second supply voltage.

20 Claims, 20 Drawing Sheets

(56)        References Cited

U.S. PATENT DOCUMENTS

| | | | |
|---|---|---|---|
| 2008/0186789 A1* | 8/2008 | Sumi ..................... | G11C 17/18 365/225.7 |
| 2011/0235442 A1 | 9/2011 | Campbell et al. | |
| 2023/0041094 A1 | 2/2023 | Huang et al. | |
| 2023/0260574 A1 | 8/2023 | Portal et al. | |

* cited by examiner

316

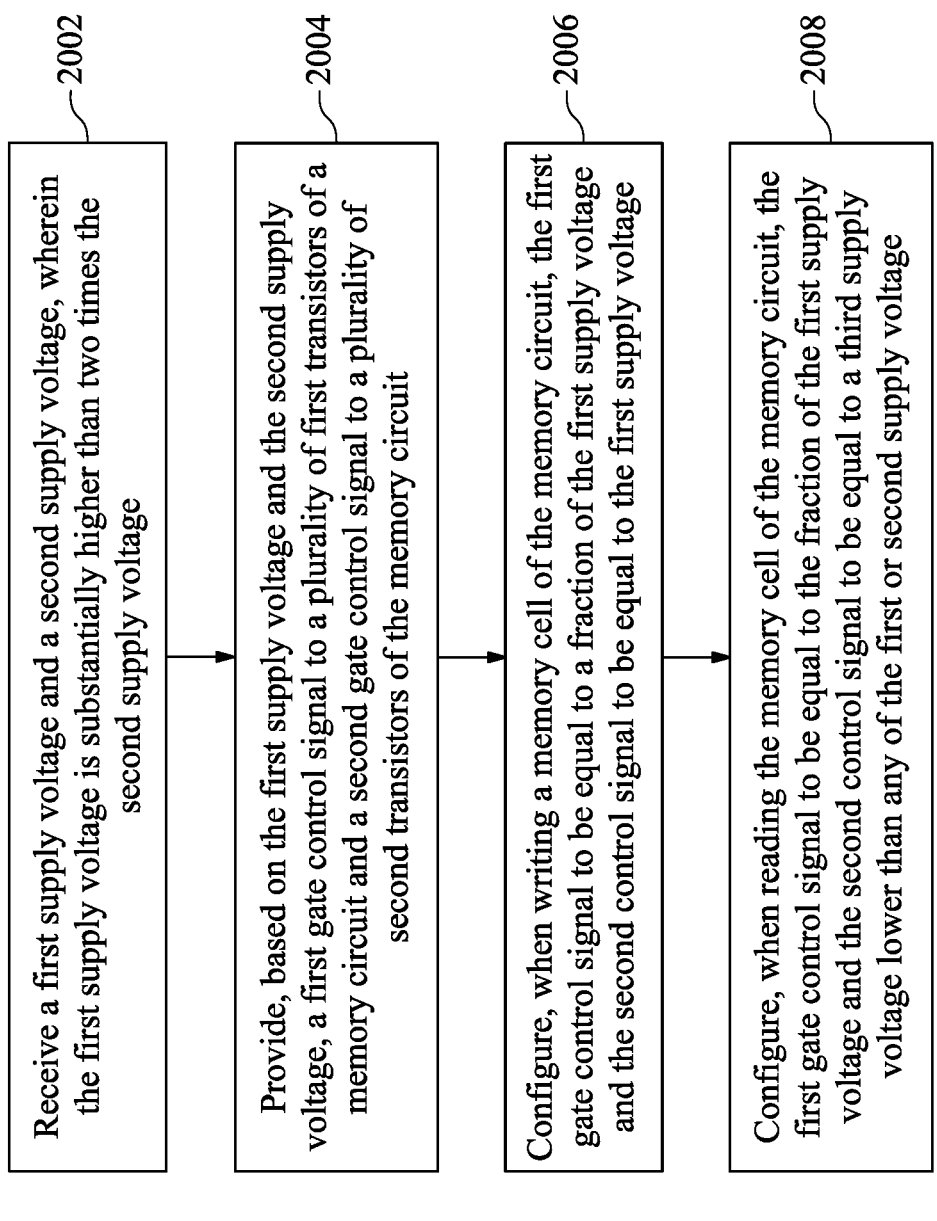

Receive a first supply voltage and a second supply voltage, wherein the first supply voltage is substantially higher than two times the second supply voltage ⌐2002

Provide, based on the first supply voltage and the second supply voltage, a first gate control signal to a plurality of first transistors of a memory circuit and a second gate control signal to a plurality of second transistors of the memory circuit ⌐2004

Configure, when writing a memory cell of the memory circuit, the first gate control signal to be equal to a fraction of the first supply voltage and the second control signal to be equal to the first supply voltage ⌐2006

Configure, when reading the memory cell of the memory circuit, the first gate control signal to be equal to the fraction of the first supply voltage and the second control signal to be equal to a third supply voltage lower than any of the first or second supply voltage ⌐2008

MEMORY DEVICES WITH STACKING CIRCUITS AND METHODS OF OPERATING THEREOF

CROSS-REFERENCE TO RELATED APPLICATION

This application claims priority to and the benefit of both U.S. Provisional Application No. 63/582,384, filed Sep. 13, 2023, and U.S. Provisional Application No. 63/611,999, filed Dec. 19, 2023, both of which are incorporated herein by reference in their entireties for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 20 illustrates a flowchart of an example method for operating a memory circuit with stacking circuits, in accordance with some embodiments of the present disclosure.

DETAILED DESCRIPTION

Figure 1:
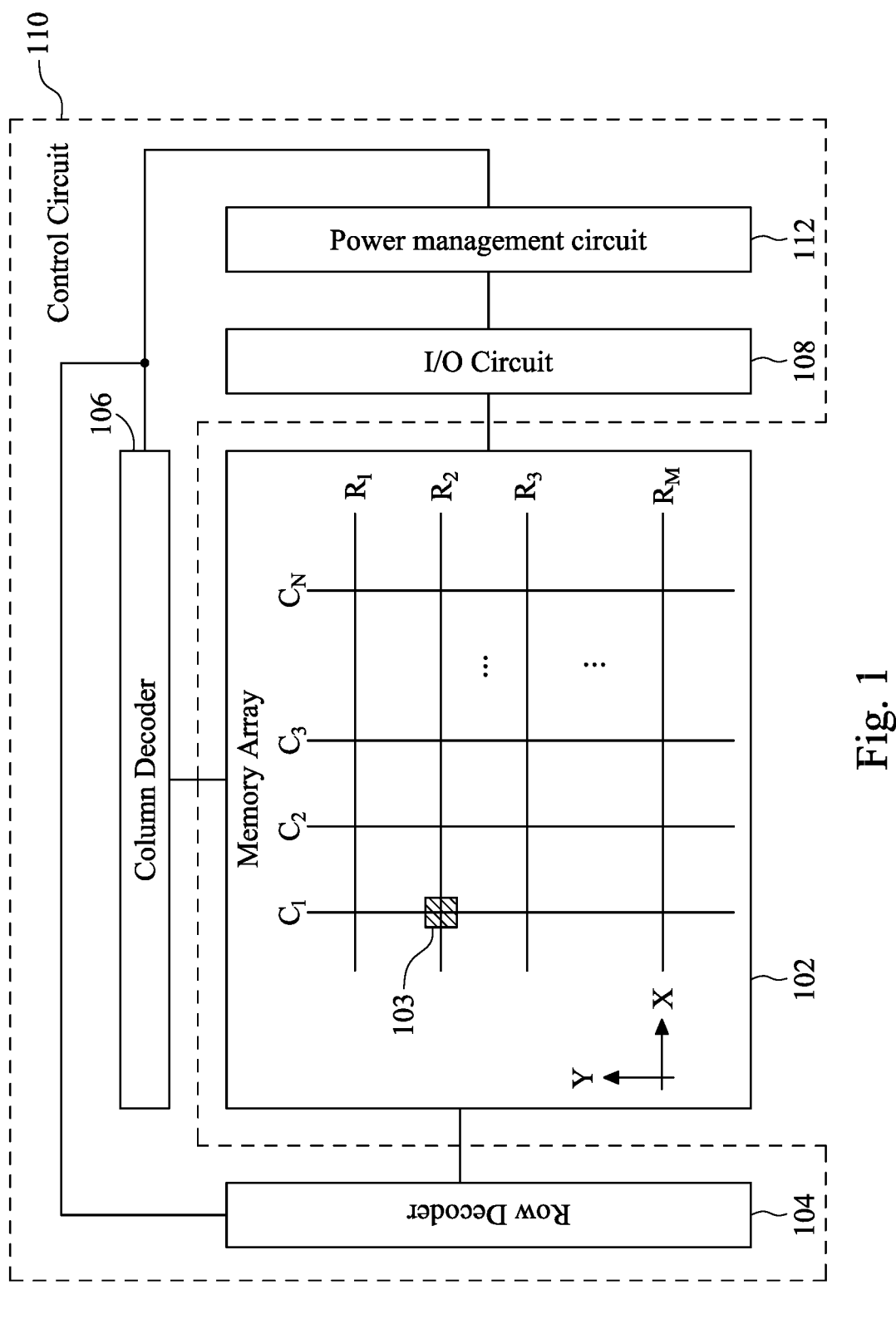
FIG. 1 illustrates a block diagram of an example memory device including a memory array, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A one-time-programmable (OTP) memory device is one of various types of the non-volatile memory device. Example implementations of the OTP memory device include metal fuses, etc. The metal fuse utilizes a metal resistor serving as a programming element of the corresponding OTP memory device. Such a metal fuse is sometimes referred to as an efuse memory device, in which the metal resistor can typically be programmed (e.g., once). The programming process typically involves burning or blowing the metal resistor, causing it to transition from a short circuit (state) to an open circuit (state). The efuse memory device is commonly utilized in integrated circuits for adjusting the circuitry after fabrication of an integrated circuit. For example, the efuse memory device is used for providing repair information that controls the usage of redundant cells in replacing defective cells of a memory array. Another use is for tuning analog circuitry by trimming a capacitive or resistive value of an analog circuit or enabling and disabling portions of the system. In yet another example, a recent trend is that an integrated circuit (or a chip) may include a plural number of efuse memory cells with respective programmed states that can collectively function as a key of the integrated circuit for encryption or decryption purposes.

The general purpose of the present disclosure is to address the common challenges associated with efuse (or general OTP) memory circuits, which typically require high voltage (e.g., above 0.96 V) for programming. In advanced node technology, there are instances where input/output (I/O) devices are not readily available, posing a significant challenge. Such an I/O device is typically referred to as a transistor that is formed with a relatively high magnitude of threshold voltage and configured to operate under a relatively high voltage, when compared a core device (or core transistor). The problem faced by older products in this context revolve around device reliability, particularly when circuits are subjected to high voltage stress. To tackle this issue, stacking core devices can be employed in advanced processes. Additionally, the present disclosure introduces a multi-stage voltage generator to alleviate power switch voltage stress, contributing to improved circuit reliability and performance. For example, the present disclosure provides various embodiments of stacking circuits implemented in a memory device. The present disclosure features stacking circuits implemented within a bit-cell and/or across all peripheral circuits in a memory system. The stacking techniques optimize the integration of memory components for enhanced performance. Among the peripheral circuits that can benefit from this approach in various embodiments can be a MVDD generator, a power switch, a half power switch, a level shifter, a sense amplifier, a delay chart, and a BL/WL controller.

FIG. 1 illustrates a block diagram of an example memory device 100 including a memory array, in accordance with some embodiments. In the illustrated embodiment of FIG. 1, the memory device 100 may include a memory array 102 and a control circuit 110. The control circuit 110 may include a row decoder 104, a column decoder 106, an input/output (I/O) circuit 108, and a power management circuit 112. Despite not being shown in FIG. 1, all of the components of the memory device 100 may be coupled to each other and to the power management circuit 112. Although, in the illustrated embodiment of FIG. 1, each component is shown as a separate block for the purpose of clear illustration, in some other embodiments, some or all of the components shown in

4

FIG. 1 may be integrated together. For example, the memory array 102 may include an embedded I/O circuit (e.g., 108).

The memory array 102 is a hardware component that stores data. In various embodiments, the memory array 102 is embodied as a semiconductor memory device. The memory array 102 includes a plurality of memory cells (or otherwise storage units) 103. The memory array 102 includes a number of rows $R_1, R_2, R_3 \ldots R_M$, each extending in a first direction (e.g., the X-direction) and a number of columns $C_1, C_2, C_3 \ldots C_N$, each extending in a second direction (e.g., the Y-direction). Each of the rows and columns may include one or more conductive (e.g., metal) structures functioning as access lines. Each memory cell 103 is arranged in the intersection of a corresponding row and a corresponding column, and can be operated according to voltages or currents through the respective conductive structures of the column and row. For example, each of the rows may include one or more corresponding word lines (WLs), and each of the columns may include one or more corresponding bit line (BLs). In some embodiments, every component, including those within the control circuit 110 and the memory array 102, can be constructed based on a stacking scheme (e.g., stacking circuits). In certain embodiments, any component in the memory device 100 that requires a high voltage (e.g., about or above 0.96 V) can be constructed based on a stacking scheme (e.g., stacking circuits).

In some embodiments, each memory cell 103 can be embodied as an efuse memory cell that may include at least one fuse resistor and a WL transistor. In various embodiments, each of the fuse resistors is coupled to the WL transistor, and the WL transistor and fuse resistor are coupled between a corresponding of the BLs and a source line which is generally tied to ground (VSS). For example, the at least one fuse resistor can be coupled to each other in series, and one of the at least one fuse resistor may have a terminal electrically connected to a first source/drain terminal of the WL transistor. Further, another one of the at least one fuse resistor may have a terminal electrically connected to the corresponding BL. In another example, the at least one fuse resistor can be coupled to each other in parallel, and the at least one fuse resistor may each have a first terminal electrically connected to the first source/drain of the WL transistor. Further, the at least one fuse resistor may each have a second terminal electrically connected to the corresponding BL. In either of the examples, a gate terminal of the WL transistor can be connected to the corresponding WL, and a second source/drain terminal of the WL transistor can be connected to the source line. Details of various implementations of the efuse memory cell will be discussed in further detail with respect to FIG. 2. In some other embodiments, each of the memory cells 103 may be implemented as any of various other non-volatile memory cells. For example, the memory cell 103 may include a resistive random access memory (RRAM) cell, a magnetoresistive random access memory (MRAM) cell, a phase-change random access memory (PCRAM) cell, an anti-fuse, etc., while remaining within the scope of the present disclosure.

The control circuit 110 can be a hardware component that can control the coupled components (e.g., 102 through 112). The row decoder 104 can be a hardware component that can receive a row address of the memory array 102 and assert a conductive structure (e.g., the WL) at that row address. The column decoder 106 can be a hardware component that can receive a column address of the memory array 102 and assert a conductive structure (e.g., the BL) at that column address. The I/O circuit 108 can be a hardware component that can access (e.g., read, program) each of the memory cells 103 asserted through the row decoder 104 and column decoder 106. The I/O circuit 108 can be operatively coupled to the memory array 102 and configured to read or write each of the memory cells 103. The power management circuit 112 can be a hardware component that provide at least one gate control signal based on at least one supply voltage to control the voltage of every component in the memory device 100. The power management circuit 112 can be operatively coupled to the memory array 102 and the I/O circuit 108. For example, the power management circuit 112 can be configured to provide a first gate control signal and a second gate control signal based on a received first supply voltage and a received second supply voltage. The first supply voltage can be substantially higher than two times the second supply voltage.

Figure 2:
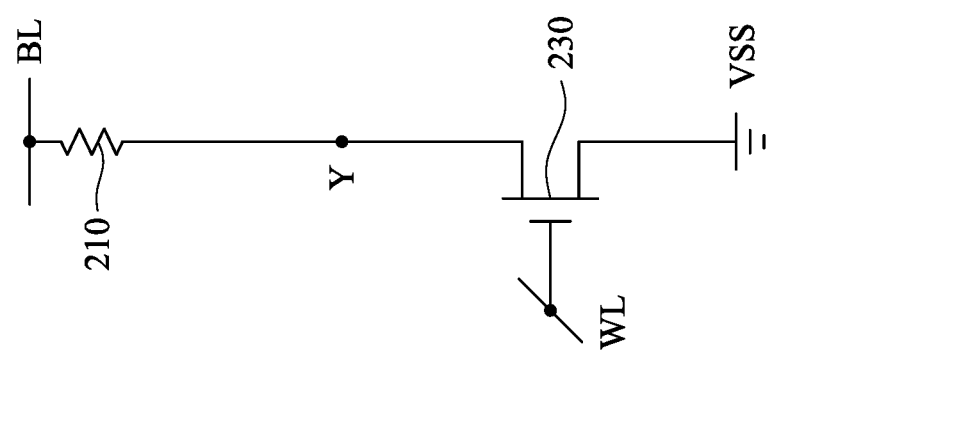
FIG. 2 illustrates a schematic diagram of an efuse memory cell of the memory array of FIG. 1, in accordance with some embodiments.

FIG. 2 illustrates an example configuration 200 of the efuse memory cell 103, in accordance with various embodiments. Hereinafter, the configuration in FIG. 2 can be referred to as "efuse memory cell 200". In various embodiments, the efuse memory cell 200 may have at least one fuse resistor, causing the disclosed efuse memory cell to present a logic state with a randomly programmed fuse resistor. Further, the fuse resistor can be physically formed in different vertical positions with respect to a substrate, which may make a position of the programmed fuse resistor difficult to be identified.

Referring to FIG. 2, the efuse memory cell 200 includes a first fuse resistor 210 and a WL transistor 230 serially connected to one another between a BL and ground (VSS), with the WL transistor 230 gated through a WL. For example, the first fuse resistor 210 may have a first terminal and a second terminal, and the WL transistor 230 may have a first source/drain terminal and a second source/drain terminal. The first terminal of the first fuse resistor 210 can be connected to the BL, the second terminal of the first fuse resistor 210 can be connected to the first source/drain terminal of the WL transistor 230 at node "Y," and the second source/drain terminal of the WL transistor 230 can be connected to ground.

The WL transistor 230 may be formed along the major (e.g., frontside) surface of a semiconductor substrate, which is sometimes referred to as part of front-end-of-line (FEOL) processing/network. Over the frontside surface, a number of first (or frontside) metallization layers, each of which may include a number of interconnect (e.g., metal) structures/tracks, can be formed, which are sometimes referred to as part of back-end-of-line (BEOL) processing/network. Such frontside metallization layers are sometimes referred to as M0 layer, M1 layer, M2 layer, and so on, and accordingly the frontside metal tracks included in the corresponding metallization layer (e.g., MX layer) are sometimes referred to as MX tracks. Over a backside surface of the substrate, a number of second (or backside) metallization layers, each of which may include a number of interconnect (e.g., metal) structures/tracks, can be formed. Such backside metallization layers are sometimes referred to as BM0 layer, BM1 layer, BM2 layer, and so on. Such backside metallization layers are sometimes referred to as BM0 layer, BM1 layer, BM2 layer, and so on, and accordingly the backside metal tracks included in the corresponding metallization layer (e.g., BMX layer) are sometimes referred to as BMX tracks.

In some embodiments, the first fuse resistor 210 can be formed as a number of backside metal tracks. In some embodiments, the first fuse resistor 210 can be formed as a number of frontside metal tracks. In some other embodiments, the first fuse resistor 210 can be formed as a number of frontside metal tracks in a first frontside metallization layer. Stated another way, the metal tracks operatively serving as the first fuse resistor 210, and the WL transistor 230 are vertically spaced from one another, in various embodiments of the present disclosure.

Figure 3:
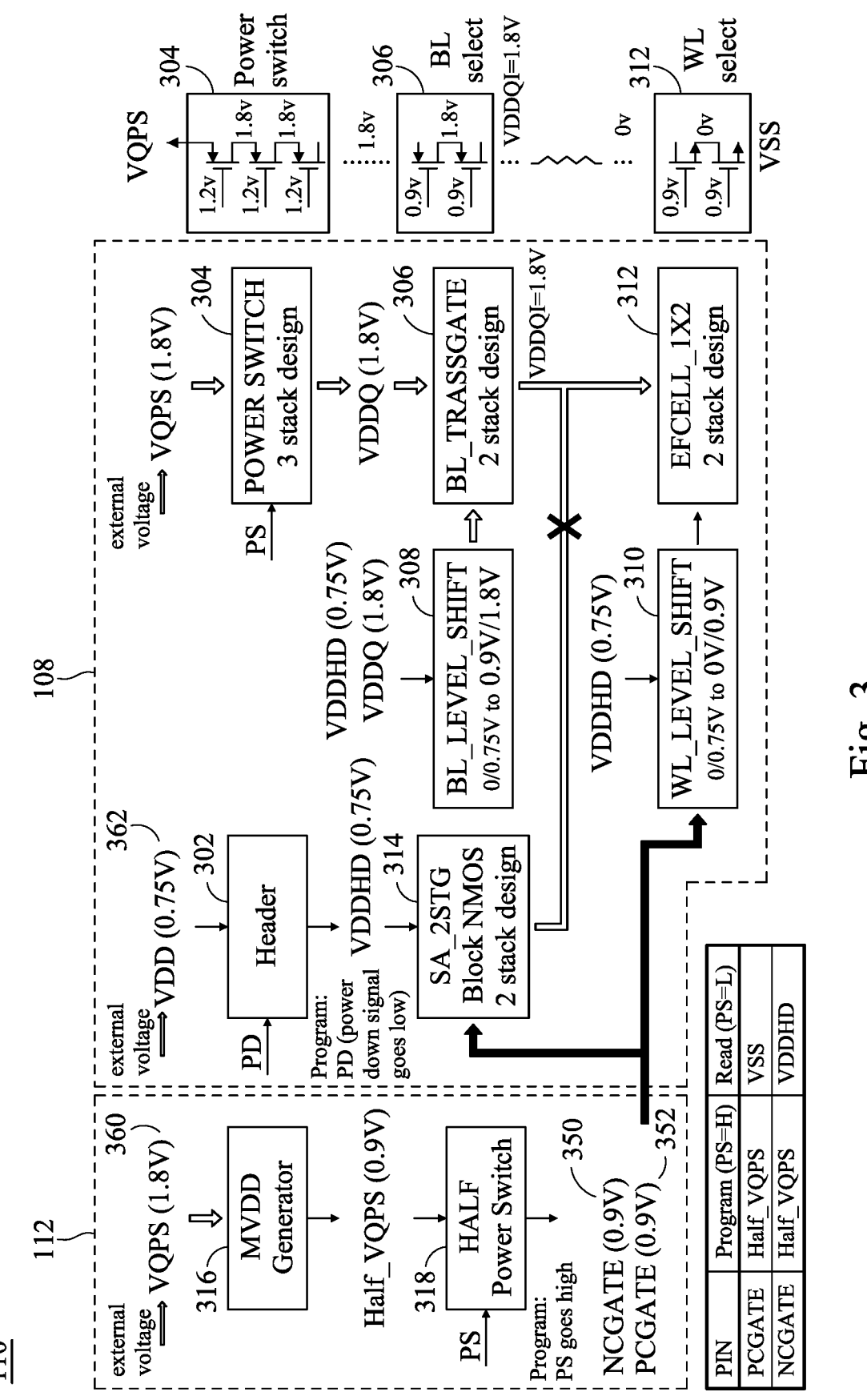
FIG. 3 illustrates a block diagram of an example control circuit with stacking circuits, in accordance with some embodiments of the present disclosure.

FIG. 3 illustrates a block diagram of an example control circuit 110 with stacking circuits, in accordance with some embodiments of the present disclosure. FIG. 3 illustrates an example operation of a memory device under program/write mode. In the illustrated embodiment of FIG. 3, the control circuit 110 may include an input/output (I/O) circuit 108 and a power management circuit 112.

The I/O circuit 108 may include a header 302, a power switch 304, a bit line (BL) control circuit 306 (e.g., a BL trassgate, a BL select), a BL level shifter 308, a word line (WL) level shifter 310, a WL control circuit 312 (e.g., an efuse cell, a WL select), and a plurality of sensing amplifiers 314. The power management circuit 112 may include a MVDD generator 316 and a half power switch 318. In some embodiments, each component (e.g., 302 through 318) within the control circuit 110 can be constructed based on a stacking scheme (e.g., stacking circuits). The header device 302 may be electrically coupled at least to the plurality of sensing amplifiers 314, in some embodiments. The power switch 304 may comprise a plurality of first p-type transistors electrically stacked with respect to one another. For example, the power switch 304 may comprise three stack design. The bit line (BL) control circuit 306 may comprise a plurality of second p-type transistors electrically stacked with respect to one another. For example, the BL control circuit (e.g., BL_TRASSGATE, BL select) 306 may comprise two stack design. The BL control circuit 306 may receive supply voltages (e.g., VDDQ, VDDHD) from the BL level shifter 308 and the power switch 304. The BL level shifter 308 may comprise a plurality of third p-type transistors electrically stacked with respect to one another. The BL level shifter 308 may receive a supply voltage VDDHD (e.g., about 0.75 V) and a supply voltage VDDQ (e.g., about 1.8 V).

In some embodiments, the BL level shifter 308 can be configured to shift voltage from a first voltage domain (e.g., about 0~0.75V) to a second voltage domain (e.g., about 0.9~1.8V) for the BL control circuit 306. The first voltage domain can be ranging from the third supply voltage (e.g., about 0V) to the second supply voltage (e.g., about 0.75V). The second voltage domain can be ranging from the first fraction of the first supply voltage (e.g., about 0.9V) to the first supply voltage (e.g., about 1.8V). In some embodiments, the BL level shifter 308 may comprise a delay circuit.

In some embodiments, the word line (WL) level shifter 310 may comprise a plurality of fourth p-type transistors electrically stacked with respect to one another. The WL level shifter 310 may receive a supply voltage VDDHD (e.g., about 0.75 V) and a gate control signal (e.g., a NCGATE or a PCGATE) from the power management circuit 112. In some embodiments, the WL level shifter 310 can be configured to shift voltage from a first voltage domain (e.g., about 0~0.75V) to a third voltage domain (e.g., about 0~0.9V) for the memory cells. The first voltage domain can be ranging from the third supply voltage (e.g., about 0V) to the second supply voltage (e.g., about 0.75V). The second voltage domain can be ranging from the third supply voltage (e.g., about 0V) to the first fraction of the first supply voltage (e.g., about 0.9V) or to a second fraction of the first supply voltage (e.g., about 1.2V). The second fraction (e.g., about 2/3) can be greater than the first fraction (e.g., about 1/2). In some embodiments, the WL level shifter 310 may comprise a CSB control circuit. The CSB control circuit can be configured to shift voltage from a third voltage domain (e.g., about 0~0.9V) to a first voltage domain (e.g., about 0~0.75V) for the memory cells during read mode. The word line (WL) control circuit 312 may comprise a fuse resistor and a plurality of second n-type transistors electrically stacked with respect to one another. For example, the WL control circuit (e.g., EFCELL, WL select) 312 may comprise two stack design. The WL control circuit 312 may receive supply voltages (e.g., VDDQI, VDDHD) from the WL level shifter 310 and the BL control circuit 306. The plurality of sensing amplifiers 314 may each comprise a plurality of first n-type transistors. For example, the plurality of sensing amplifiers 314 may comprise two stack design. The plurality of sensing amplifiers 314 may receive a supply voltage VDDHD from the header 302. In some embodiments, each of the WL control circuits 312 may include a fuse resistor and a plurality of second n-type transistors coupled to each other in series. The plurality of second n-type transistors can be electrically stacked with respect to one another.

In some embodiments, the power management circuit 112 can be configured to provide a first gate control signal 350 (e.g., NMOS control gate (NCGATE)) and a second gate control signal 352 (e.g., PMOS control gate (PCGATE)) based on a received first supply voltage 360 (e.g., VQPS) and a received second supply voltage 362 (e.g., VDD). In some embodiments, the first supply voltage 360 (e.g., about 1.8V) is substantially higher than two times the second supply voltage 362 (e.g., about 0.75V). For example, the supply voltage VQPS 360 (received by the control circuit 110) can be about 1.8V and the supply voltage VDD 362 (received by the control circuit 110) can be about 0.75V.

When at least one of the memory cells is being written, the first gate control signal (e.g., NCGATE) 350 can be equal to a first fraction of the first supply voltage 360 (e.g., half_VQPS) and the second control signal (e.g., PCGATE) 352 can be equal to the first fraction of the first supply voltage 360 (e.g., half_VQPS). For example, the voltage of the first gate control signal NCGATE 350 can be equal to about 0.9V (e.g., half_VQPS), which is ½ of the supply voltage VQPS 360 (about 1.8V). The voltage of the second control signal PCGATE 352 can be equal to about 0.9V (e.g., half_VQPS), which is ½ of the supply voltage VQPS 360 (about 1.8V).

In program/write mode (e.g., when PS=H), the power management circuit 112 may receive an external voltage VQPS and may provide a first gate control signal (e.g., NCGATE) 350 and a second gate control signal (e.g., PCGATE) 352. The external voltage VQPS 360 can be equal to about 1.8V. The NCGATE 350 and the PCGATE 352 can be equal to about 0.9V, which is half of the external voltage VQPS (e.g., about 1.8V). In such case, the power management circuit 112 can relax the power switch voltage stress by reducing the voltage. The BL select 306 may receive the second gate control signal PCGATE 352 and a first control signal. The first control signal can be a control signal for bit lines. In program/write mode (e.g., when PS=H), the second gate control signal PCGATE 352 can be equal to about 0.9V and the first control signal can be equal to about 0.9V. In such case, the BL select 306 is selected. The WL select 312 may receive the first gate control signal NCGATE 350 and a second control signal. The second control signal can be a control signal for word lines. In program/write mode (e.g., when PS=H), the first gate control signal NCGATE 350 can be equal to about 0.9V and the second control signal can be equal to about 0.9V. In various embodiments, the first gate control signal NCGATE can have its opposite logic states (i.e., logic "1" and logic "0") corresponding to the supply voltage and the fractional voltage, respectively, and the second gate control signal PCGATE can have its opposite logic states corresponding to the fractional voltage and a ground voltage, respectively.

In some embodiments, regardless of the memory cells being read or written/programed, a voltage across any two terminal of each of the first p-type transistors, second p-type transistors, third p-type transistors, fourth p-type transistors, first n-type transistors, and second n-type transistors can be equal to or less than the first fraction of the first supply voltage VQPS 360 (e.g., about 1.8V). The first supply voltage VQPS 360 can be configured to gate at least one of the first n-type transistors and at least one of the second n-type transistors. The second supply voltage VDD 362 can be configured to gate at least one of the first p-type transistors, at least one of the second p-type transistors, at least one of the third p-type transistors, and at least one of the fourth p-type transistors.

In some embodiments, regardless of the memory cells being read or written/programed, a voltage across any two terminal of each of the first p-type transistors, second p-type transistors, third p-type transistors, and first n-type transistors can be equal to or less than the first fraction of the first supply voltage VQPS 360 (e.g., about 0.9V). In some embodiments, the first gate control signal NCGATE 350 can be configured to gate at least one of the first n-type transistors (e.g., SA) and at least one of the second n-type transistors (e.g., WL select). The second gate control signal PCGATE 352 can be configured to gate at least one of the first p-type transistors (e.g., power switch), at least one of the second p-type transistors (e.g., BL control circuit), at least one of the third p-type transistors (e.g., BL level shifter), and at least one of the fourth p-type transistors (e.g., WL level shifter).

Figure 4:
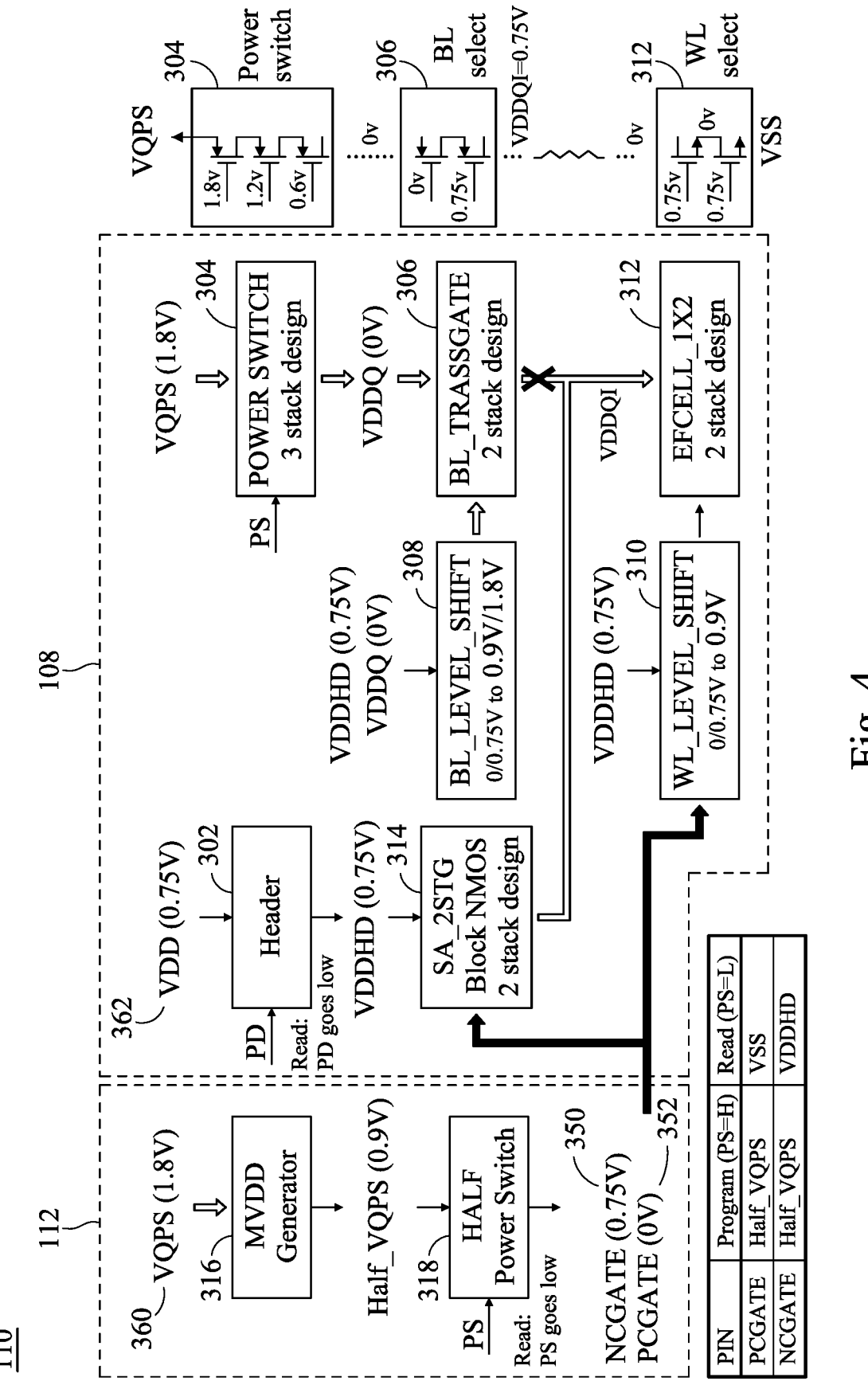
FIG. 4 illustrates a block diagram of an example control circuit with stacking circuits, in accordance with some embodiments of the present disclosure.

FIG. 4 illustrates a block diagram of an example control circuit 110 with stacking circuits, in accordance with some embodiments of the present disclosure. FIG. 4 illustrates an example operation of a memory device under read mode. In the illustrated embodiment of FIG. 4, the control circuit 110 may include an input/output (I/O) circuit 108 and a power management circuit 112. The control circuit 110 of FIG. 4 is substantially similar to the control circuit 110 of FIG. 3, except that the control circuit 110 operates in read mode.

In some embodiments, the power management circuit 112 can be configured to provide a first gate control signal 350 (e.g., NCGATE) and a second gate control signal 352 (e.g., PCGATE) based on a received first supply voltage 360 (e.g., VQPS) and a received second supply voltage 362 (e.g., VDD). In some embodiments, the first supply voltage 360 (e.g., about 0.9V) is substantially higher than two times the second supply voltage 362 (e.g., about 0.75V). For example, the supply voltage VQPS 360 (received by the control circuit 110) can be about 1.8V and the supply voltage VDD 362 (received by the control circuit 110) can be about 0.75V.

When at least one of the memory cells is being read, the first gate control signal (e.g., NCGATE) 350 can be equal to the first fraction of the second supply voltage (e.g., VDDHD) and the second control signal (e.g., PCGATE) 352 can be equal to a third supply voltage (e.g., VSS) lower than any of the first or second supply voltage. For example, the voltage of the first gate control signal NCGATE 350 can be equal to about 0.75V (e.g., VDDHD). In some embodiments, the voltage of the first gate control signal NCGATE 350 be equal to the first fraction of the second supply voltage. The voltage of the second control signal PCGATE 352 can be equal to about 0V (e.g., VSS), which is lower than any of the first or second supply voltage.

In read mode (e.g., when PS=L), the power management circuit 112 may receive an external voltage VQPS and may provide a first gate control signal (e.g., NCGATE) 350 and a second gate control signal (e.g., PCGATE) 352. The external voltage VQPS 360 can be equal to about 1.8V. The NCGATE 350 can be equal to about 0.75V. The PCGATE 352 can be equal to about 0V. In such case, the power management circuit 112 can relax the power switch voltage stress by reducing the voltage. The BL select 306 may receive the second gate control signal PCGATE 352 and a first control signal. In program/write mode (e.g., when PS=L), the second gate control signal PCGATE 352 can be equal to about 0V and the first control signal can be equal to about 0.75V. In such case, the BL select 306 is not selected. In some embodiments, the BL control signal can be received from the sensing amplifiers 314. The WL select 312 may receive the first gate control signal NCGATE 350 and a second control signal. In read mode (e.g., when PS=L), the first gate control signal NCGATE 350 can be equal to about 0.75V and the second control signal can be equal to about 0.75V.

In some embodiments, regardless of the memory cells being read or written/programed, a voltage across any two terminal of each of the first p-type transistors, second p-type transistors, third p-type transistors, fourth p-type transistors, first n-type transistors, and second n-type transistors can be equal to or less than the first fraction of the first supply voltage VQPS 360 (e.g., about 1.8V). The first supply voltage VQPS 360 can be configured to gate at least one of the first n-type transistors and at least one of the second n-type transistors. The second supply voltage VDD 362 can be configured to gate at least one of the first p-type transistors, at least one of the second p-type transistors, at least one of the third p-type transistors, and at least one of the fourth p-type transistors.

In some embodiments, regardless of the memory cells being read or written/programed, a voltage across any two terminal of each of the first p-type transistors, second p-type transistors, third p-type transistors, and first n-type transistors can be equal to or less than the first fraction of the first supply voltage VQPS 360 (e.g., about 0.9V). In some embodiments, the first gate control signal NCGATE 350 can be configured to gate at least one of the first n-type transistors (e.g., SA) and at least one of the second n-type transistors (e.g., WL select). The second gate control signal PCGATE 352 can be configured to gate at least one of the first p-type transistors (e.g., power switch), at least one of the second p-type transistors (e.g., BL control circuit), at least one of the third p-type transistors (e.g., BL level shifter), and at least one of the fourth p-type transistors (e.g., WL level shifter).

Figure 5:
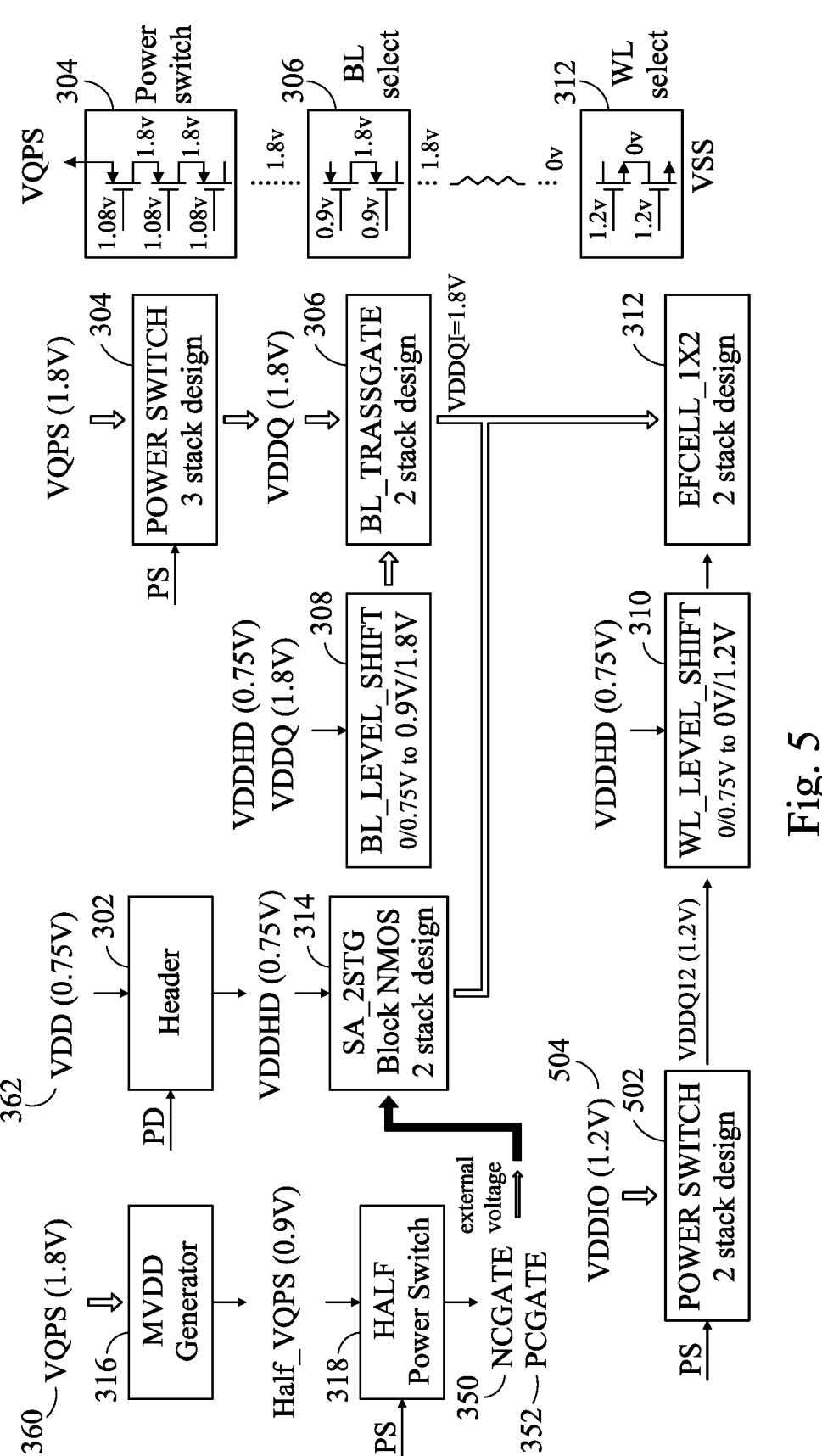
FIG. 5 illustrates a block diagram of an example control circuit with stacking circuits, in accordance with some embodiments of the present disclosure.

FIG. 5 illustrates a block diagram of an example control circuit 110 with stacking circuits, in accordance with some embodiments of the present disclosure. FIG. 5 illustrates an example operation of a memory device under write mode. In the illustrated embodiment of FIG. 5, the control circuit 110 may include an input/output (I/O) circuit 108 and a power management circuit 112. The control circuit 110 of FIG. 5 is substantially similar to the control circuit 110 of FIG. 3, except for the additional power switch 502. Increasing the supply voltages for WL select 312 may result in enhanced performance during program mode.

In some embodiments, the WL level shifter 310 may receive a supply voltage VDDHD (e.g., about 0.75 V) and a gate control signal (e.g., VDDQ12) from the additional power switch 502. The additional power switch 502 may comprise two stack design. The gate control signal can be received from a supply voltage VDDIO 504 or from a second fraction of the first supply voltage VQPS 360. The gate control signal can be equal to about 1.2V.

In some embodiments, the WL level shifter 310 can be configured to shift voltage from a first voltage domain (e.g., about 0~0.75V) to a third voltage domain (e.g., about 0~1.2V) for the memory cells. The first voltage domain can be ranging from the third supply voltage (e.g., about 0V) to the second supply voltage (e.g., about 0.75V). The second voltage domain can be ranging from the third supply voltage (e.g., about 0V) to a second fraction (e.g., about ⅔) of the first supply voltage VQPS 360 (e.g., about 1.2V). The second fraction (e.g., about ⅔) can be greater than the first fraction (e.g., about ½). In some embodiments, the WL level shifter 310 may comprise a CSB control circuit. The word line (WL) control circuit 312 may comprise a fuse resistor and a plurality of second n-type transistors electrically stacked with respect to one another. For example, the WL control circuit (e.g., EFCELL, WL select) 312 may comprise two stack design. The WL control circuit 312 may receive supply voltages (e.g., VDDQI, VDDHD) from the WL level shifter 310 and the BL control circuit 306.

In program/write mode (e.g., when PS=H), the power management circuit 112 may receive an external voltage VQPS and may provide a first gate control signal (e.g., NCGATE) 350 and a second gate control signal (e.g., PCGATE) 352. The external voltage VQPS 360 can be equal to about 1.8V. The NCGATE 350 and the PCGATE 352 can be equal to about 0.9V, which is half of the external voltage VQPS (e.g., about 1.8V). In such case, the power management circuit 112 can relax the power switch voltage stress by reducing the voltage. The BL select 306 may receive the second gate control signal PCGATE 352 and a first control signal. In program/write mode (e.g., when PS=H), the second gate control signal PCGATE 352 can be equal to about 0.9V and the first control signal can be equal to about 0.9V. In such case, the BL select 306 is selected. The WL select 312 may receive the first gate control signal NCGATE 350 and a second control signal. In program/write mode (e.g., when PS=H), the first gate control signal NCGATE 350 can be equal to about 1.2V and the second control signal can be equal to about 1.2V. By increasing the supply voltages for the WL select 312, the memory circuit 100 may result in enhanced performance during program mode.

Figure 6:
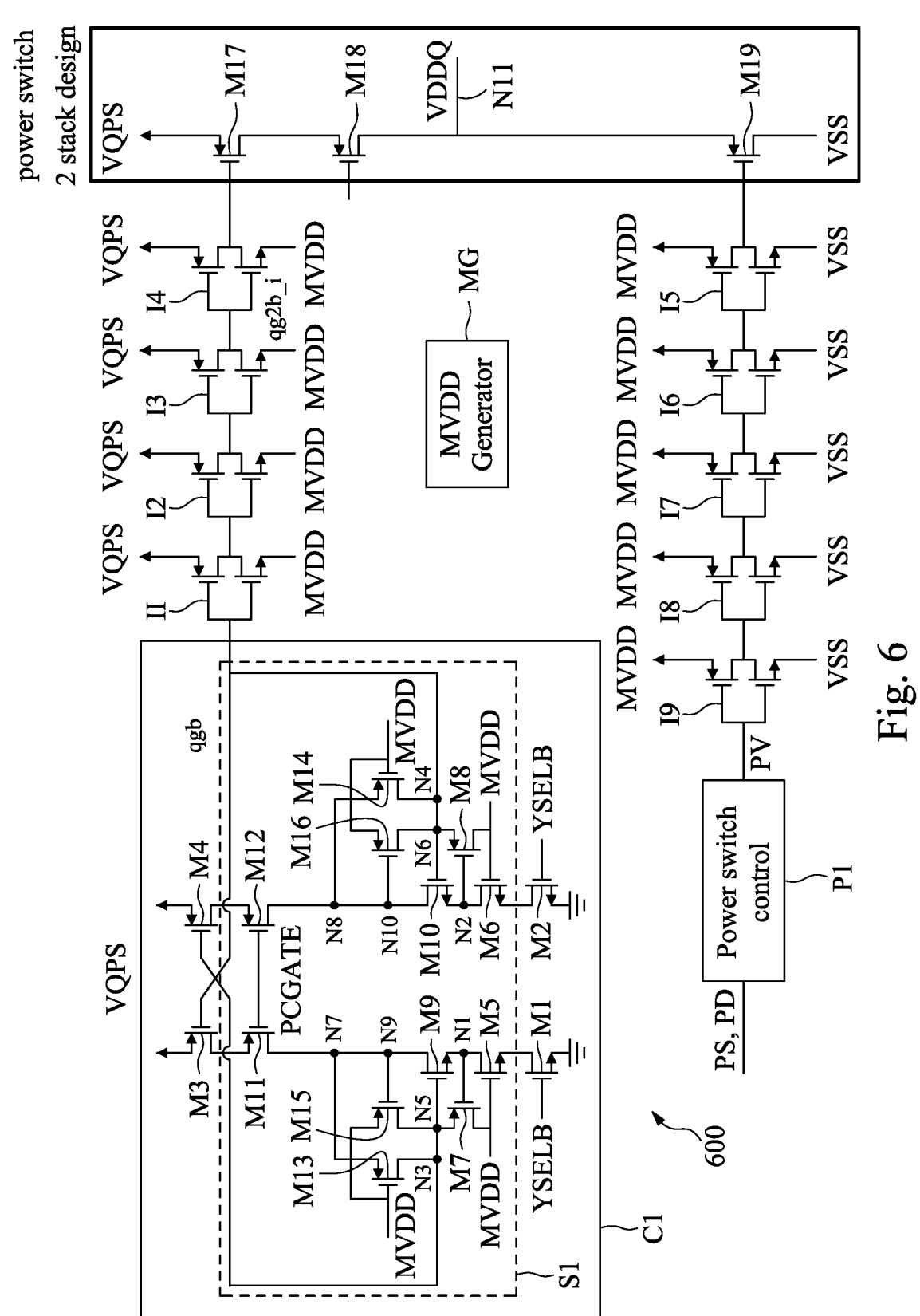
FIG. 6 illustrates an example circuit diagram of a power switch that can be implemented by the control circuit 110 of FIG. 1, in accordance with some embodiments of the present disclosure.

FIG. 6 illustrates an example circuit diagram of a power switch (2 stack design) that can be implemented by the control circuit 110 of FIG. 1, in accordance with some embodiments of the present disclosure. The control circuit 600 includes a voltage level shifter C1, a power switch control circuit P1, a fractional voltage generator MG, a number of first inverters I1-I4, and a number of second inverters I5-I9. In general, the fractional voltage generator MG can provide a fractional voltage of a supply voltage for the voltage level shifter C1. The voltage level shifter C1 can generate, based on the fractional voltage, a first intermediate signal with its opposite logic states corresponding to the supply voltage and the fractional voltage, respectively. The power switch control circuit P1 can generate a second intermediate signal with its opposite logic states corresponding to the fractional voltage and a ground voltage, respectively. The first inverters I1-I4 and the second inverters I5-I9 can then input the first intermediate signal and the second intermediate signal, respectively, to collectively determine a voltage level at an output node of the control circuit 600. In FIG. 6, stacking transistors reduces the VQPS stress (e.g., ½ VQPS stress) on each individual transistor within the power switch.

The voltage level shifter C1 may include a voltage modulation circuit (voltage multi structure) S1 coupled between PMOS transistors M3 and M4, and NMOS transistors M1 and M2, that is configured to provide an intermediate signal qgb based on control signals YSELB and YSELB'. In various embodiments, the control signal YESLB and YSELB', served as input signals of the control circuit 600, may each transition within a first voltage domain (e.g., from 0V (VSS) to 0.75V (VDD)). With the voltage level shifter C1, the intermediate signal qgb can be presented with a first logic state corresponding to the supply voltage VQPS or a second logic state corresponding to a fractional voltage MVDD that is a fraction of the supply voltage VQPS. For example, the supply voltage VQPS (received by the control circuit 600) can be about 1.8V, while the fractional voltage MVDD is about a half of VQPS, e.g., about 0.9V. Stated another way, the control signal YSELB/YSELB' in a first voltage domain (0~0.75V) can be shifted as the intermediate signal qgb in a second voltage domain (0.9~1.8V).

The voltage level shifter C1 may include an NMOS transistor M1 gated with the control signal YSELB and sourced with a ground voltage. The voltage level shifter C1 may include an NMOS transistor M2 gated with the control signal YSELB' complementary to the control signal YSELB and sourced with the ground voltage. The voltage level shifter C1 includes a PMOS transistor M3 sourced with the supply voltage VQPS. The control circuit may include a PMOS transistor M4 sourced from the supply voltage VQPS.

In particular, the voltage multi structure S1 (of the voltage level shifter C1) may include an NMOS transistor M5 gated with the fractional voltage MVDD and connected to the NMOS transistor M1. The voltage multi structure S1 may include an NMOS transistor M6 gated with the fractional voltage MVDD and connected to the NMOS transistor M2. The voltage multi structure S1 may include a PMOS transistor M7 gated with a drain voltage of the NMOS transistor M6 and drained with the fractional voltage MVDD. The voltage multi structure S1 may include a PMOS transistor M8 gated with a drain voltage of the NMOS transistor M6 and drained with the fractional voltage MVDD. The voltage multi structure S1 may include an NMOS transistor M9 gated with a source voltage of the PMOS transistor M7, which is also coupled to the intermediate signal qgb. The voltage multi structure S1 may include an NMOS transistor M10 gated with a source voltage of the PMOS transistor M8, which is also coupled to the intermediate signal qgb.

In some embodiments, the voltage multi structure S1 may include a PMOS transistor M11 connected to the PMOS transistor M3, and a PMOS transistor M12 connected to the PMOS transistor M4. The PMOS transistors M11 and M12 can be commonly gated by signal PCGATE, which can be a fixed voltage (e.g., 0.9V when fractional voltage MVDD is supplied at 0.9V). The voltage multi structure S1 may include a PMOS transistor M13 gated by the fractional voltage MVDD, and a PMOS transistor M14 gated by the fractional voltage MVDD. The voltage multi structure S1 may include a PMOS transistor M15 sourced by the fractional voltage MVDD, and a PMOS transistor M16 sourced by the fractional voltage MVDD.

Further, the control circuit 600 may include inverters I1, I2, I3, and I4 serially coupled to one another, each of which is coupled between the supply voltage VQPS and the fractional voltage MVDD. The control circuit 600 may include a PMOS transistor M17 sourced with the supply voltage VQPS and drained with an output voltage VDDQ. The control circuit 600 may include a PMOS transistor M18 gated with the fractional voltage MVDD, connected to the PMOS transistor M17, and drained with the output voltage VDDQ. The control circuit 600 may include an NMOS transistor M19 sourced with the ground voltage and drained with the output voltage VDDQ. The control circuit 600 may further include the inverters I5, I6, I7, I8, and I9 serially coupled to one another, each of which is coupled between the supply voltage VQPS and the fractional voltage MVDD. The control circuit 600 may include a power switch control circuit P1 configured to output, based on control signals PS and PD (which are complementary to each other), an intermediate signal PV. In various embodiments, power switch control circuit P1 can also include a level shifter powered by the fractional voltage MVDD, which shifts the control signal PS/PD (e.g., in the first voltage domain, from 0V (VSS) to 0.75V (VDD)) as the intermediate signal PV presented with a first logic state corresponding to the fractional voltage MVDD or a second logic state corresponding to the ground voltage. Stated another way, the control signal PS/PD in the first voltage domain (0~0.75V) can be shifted as the intermediate signal PV in a third voltage domain (0~0.9V).

In various embodiments, such two intermediate signals qgb and PV can be input to the serially coupled inverters I1-I4 and I5-I9, respectively, so as to cause either the supply voltage VQPS or the ground voltage VSS to be output as the output voltage VDDQ. Alternatively stated, the control circuit 600 can shift a signal from a first voltage domain to a second voltage domain. For example, the control circuit 600 can convert the control signal YSELB/YSELB', which is in a first voltage domain (0~0.75V), as the intermediate signal qgb, which is in a second voltage domain (0.9~1.8V). Further, with the intermediate signal PV (output by the power switch control circuit P1) in a third voltage domain (0~0.9V), the control circuit 600 can provide the output voltage VDDQ in a fourth voltage domain (0~1.8V). Example operation of the control circuit 600 will be described as follows.

To illustrate operation of the disclosed voltage level shifter C1, some of the nodes are referenced as follows. For example in FIG. 6, the voltage multi structure S1 may include a node N1 connected to the drain of the NMOS transistor M5, the gate of the PMOS transistor M7, and the source of the NMOS transistor M9. The voltage multi structure may include a node N2 connected to the drain of the NMOS transistor M6, the gate of the PMOS transistor M8, and the source of the NMOS transistor M10. The voltage multi structure S1 may include a node N3 connected to the gate of the PMOS transistor M4, the drain of the PMOS transistor M13, and the gate of the NMOS transistor M9. The voltage multi structure S1 may include a node N4 connected to the gate of the PMOS transistor M3, the drain of the PMOS transistor M14, and the gate of the NMOS transistor M10. The voltage multi structure S1 may include a node N5 connected to the gate of the PMOS transistor M3, the drain of the PMOS transistor M15, and the gate of the NMOS transistor M9. The voltage multi structure S1 may include a node N6 connected to the gate of the PMOS transistor M3, the drain of the PMOS transistor M16, and the gate of the NMOS transistor M10. The voltage multi structure S1 includes a node N7 connected to the drain of the PMOS transistor M11, the source of the PMOS transistor M13, and the drain of the NMOS transistor M9. The voltage high PV is inverted and outputted as logic low by the inverter I9, which is further inverted and outputted by the inverter I8 as logic high, and so on. As such, an output of the inverter I6, pstb1, is logic high, and further inverted and outputted by the inverter I5 as logic low to turn off the NMOS transistor M19.

Table I below summarizes respective logic states/voltage levels at some of the nodes of the control circuit 600.

TABLE I

| Input/Output | PS | PD | VDDQ | YSELB | YSELB' | qgb | qg2b_i | pstb 1 |
|---|---|---|---|---|---|---|---|---|
| Logic State/Voltage | High (e.g., 0.75 V) | Low (e.g., 0 V) | High (e.g., 1.8 V) | Low (e.g., 0 V) | High (e.g., 0.75 V) | Low (e.g., 0.9 V) | High (e.g., 1.8 V) | High (e.g., 0.9 V) | multi structure S1 may include a node N8 connected to the drain of the PMOS transistor M12, the source of the PMOS transistor M14, and the drain of the NMOS transistor M10. The voltage multi structure S1 may include a node N9 connected to the drain of the PMOS transistor M11, the gate of the PMOS transistor M15, and the drain of the NMOS transistor M9. The voltage multi structure S1 may include a node N10 connected to the drain of the PMOS transistor M12, the gate of the PMOS transistor M16, and the drain of the NMOS transistor M10. Node N11, with which the PMOS transistor M18 and the NMOS transistor M19 are commonly drained, outputs the voltage VDDQ from the control circuit 600.

In response to the control signals YSELB and YSELB' being provided at low (e.g., 0V) and high (e.g., 0.75V), respectively, the low YSELB gate voltage turns off the NMOS transistor M1, and the high YSELB' gate voltage turns on the NMOS transistor M2. The NMOS transistor M2 pulls down its drain voltage to 0V. The NMOS transistor M6, gated by the fractional voltage MVDD, can be turned on, which, pulls down the voltage at the node N2 to 0V. Such 0V at the node N2, gating the PMOS transistor M8, can turn on the PMOS transistor M8. As such, source and drain of the PMOS transistor M8 can be approximately presented with the same voltage (MVDD, e.g., 0.9V). This causes the intermediate signal qgb to be equal to the fractional voltage MVDD, which is logic low.

Concurrently, the control signals PS and PD may be provided to the power switch control circuit P1 as high (e.g., 0.75V) and low (e.g., 0V), respectively. This can allow the power switch control circuit P1 to output the intermediate signal PV equal to the fractional voltage MVDD (e.g., 0.9V), which is logic high. By inputting the intermediate signals qgb (at logic low) and PV (at logic high) to the serially coupled inverters I1-I4 and I5-I9, respectively, the PMOS transistors M17 can be turned on (with the PMOS transistor M18 always being turned on) and the NMOS transistor M19 can be turned off, which allows the supply voltage VQPS to be coupled to the output node N11, i.e., presenting the output voltage VDDQ at VQPS (1.8V). For example, the logic low qgb is inverted and outputted as logic high by the inverter I1, which is further inverted and outputted by the inverter I2 as logic low, which is further inverted and outputted by the inverter I3 as logic high. As such, an output of the inverter I3, qg2b_i, is logic high, and further inverted and outputted by the inverter I4 as logic low to turn on the PMOS transistor M17. Similarly, the logic In response to the control signal YSELB being high (e.g., 0.75V) and the control signal YSELB' being low (e.g., 0V), the high YSELB gate voltage turns on the NMOS transistor M1, and the low YSELB' gate voltage turns off the NMOS transistor M2. The NMOS transistor M1 pulls down its drain voltage to 0V. The NMOS transistor M5, gated by the fractional voltage MVDD, can be turned on, which, pulls down the voltage at the node N1 to 0V. Such 0V at the node N1, gating the PMOS transistor M7, can turn on the PMOS transistor M7. As such, source and drain of the PMOS transistor M7 can be approximately presented with the same voltage (MVDD, e.g., 0.9V). This causes the PMOS transistor M4 to be turned on, which can help pass the VQPS (at the source of the PMOS transistor M4) to a source of the PMOS transistor M12 that is gate by the fixed voltage (PCGATE). Accordingly, a drain of the PMOS transistor M12 is about equal to 1.8V, which causes the PMOS transistor M14, gated by the MVDD (e.g., 0.9V), to be turned on and thus causes its drain to be presented at 1.8V. As such, the intermediate signal qgb (tied to the drain of the PMOS transistor M14) is equal to 1.8V (i.e., the supply voltage VQPS), which is logic high.

Concurrently, the control signals PD and PS may be provided to the power switch control circuit P1 as high (e.g., 0.75V) and low (e.g., 0V), respectively. This can allow the power switch control circuit P1 to output the intermediate signal PV equal to the ground voltage (e.g., 0V), which is logic low. By inputting the intermediate signals qgb (at logic high) and PV (at logic low) to the serially coupled inverters I1-I4 and I5-I9, respectively, the PMOS transistors M17 can be turned off and the NMOS transistor M19 can be turned on, which allows the ground voltage to be coupled to the output node N11, i.e., presenting the output voltage VDDQ at ground voltage (0V). For example, the logic high qgb is inverted and outputted as logic low by the inverter I1, which is further inverted and outputted by the inverter I2 as logic high, which is further inverted and outputted by the inverter I3 as logic low. As such, an output of the inverter I3, qg2b_i, is logic low, and further inverted and outputted by the inverter I4 as logic high to turn off the PMOS transistor M17. Similarly, the logic low PV is inverted and outputted as logic high by the inverter I9, which is further inverted and outputted by the inverter I8 as logic low, and so on. As such, an output of the inverter I6, pstb1, is logic low, and further inverted and outputted by the inverter I5 as logic high to turn on the NMOS transistor M19.

Table II below summarizes respective logic states/voltage levels at some of the nodes of the control circuit 600.

TABLE II

| Input/Output | PS | PD | VDDQ | YSELB | YSELB' | qgb | qg2b_i | pstb 1 |
|---|---|---|---|---|---|---|---|---|
| Logic State/ Voltage | Low (e.g., 0 V) | High (e.g., 0.75 V) | Low (e.g., 0 V) | High (e.g., 0.75 V) | Low (e.g., 0 V) | High (e.g., 1.8 V) | Low (e.g., 0.9 V) | Low (e.g., 0 V) |

Figure 7:
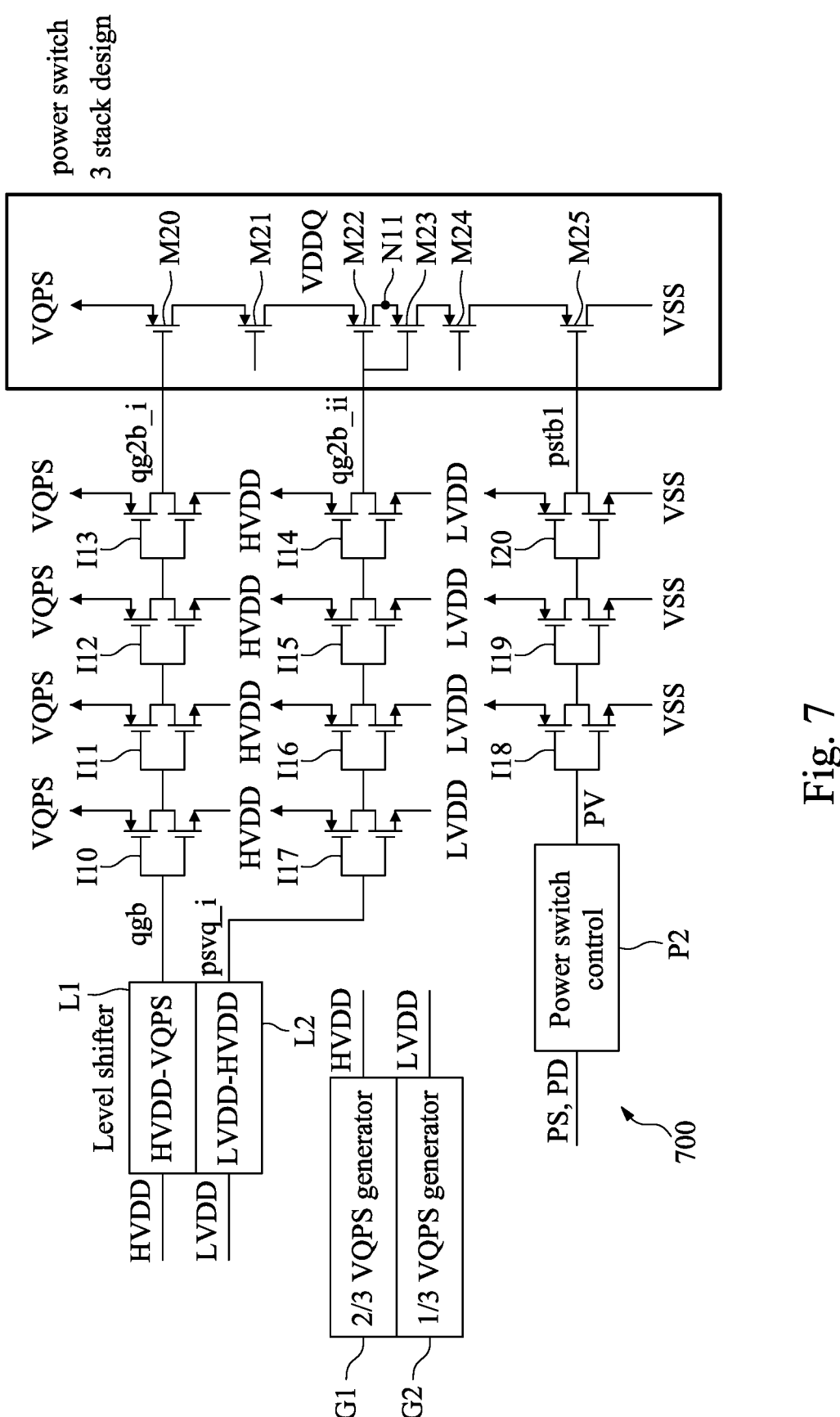
FIG. 7 illustrates an example circuit diagram of a power switch that can be implemented by the control circuit 110 of FIG. 1, in accordance with some embodiments of the present disclosure.

FIG. 7 illustrates an example circuit diagram of a power switch (3 stack design) that can be implemented by the control circuit 110 of FIG. 1, in accordance with some embodiments of the present disclosure. The control circuit 700 is similar to the control circuit 600 (FIG. 6), except that the control circuit 700 can provide an output voltage based on more than one fractional voltage. As such, the control circuit 700 can shift an input voltage to a relatively wider voltage domain (compared to the control circuit 600), or each of the transistors of the control circuit 700 can operate with an even lower voltage stress (compared to the control circuit 600). Thus, the following discussions of the control circuit 700 will be focused on the difference. In FIG. 7, stacking transistors reduces the VQPS stress (e.g., ⅓ VQPS stress) on each individual transistor within the power switch.

For example, the control circuit 700 may include first and second fractional voltage generators G1 and G2, two voltage level shifters L1 and L2, a power switch control circuit P2, and a first set of serially coupled inverters I10, I11, I12, and I13, a second set of serially coupled inverters I14, I15, I16, and I17, and a third set of serially coupled inverters I18, I19, and I20. The voltage generators G1 and G2 can provide a first fractional voltage HVDD and a second fractional voltage LVDD, respectively. In some embodiments, the supply voltage VQPS (received by the control circuit 700) can be about 1.8V, while the fractional voltage HVDD is about two thirds of VQPS, i.e., about 1.2V, and the fractional voltage LVDD is about one third of VQPS, i.e., about 0.6V. The HVDD and LVDD can power the level shifters L1 and L2, respectively.

Figure 16:
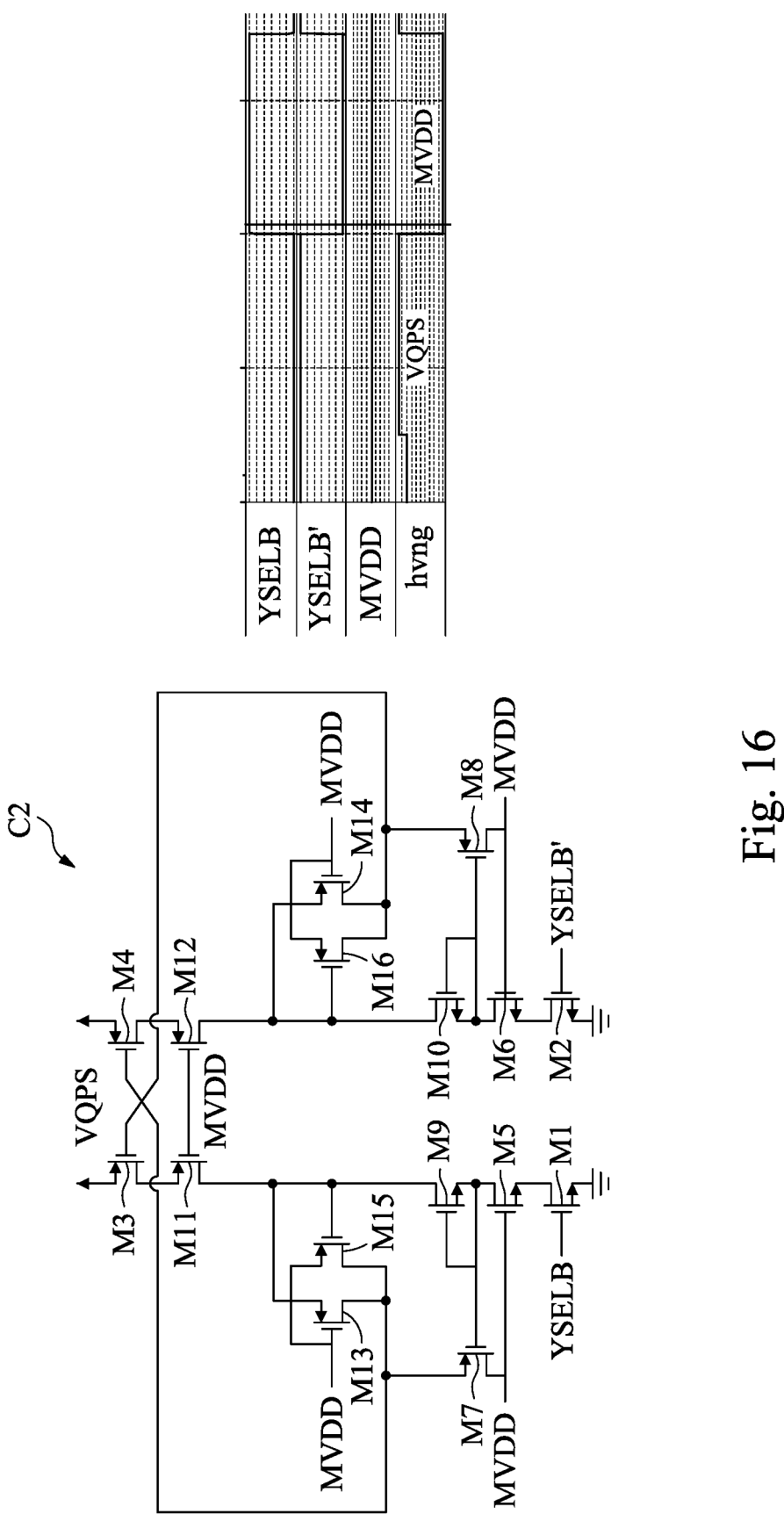
FIG. 16 illustrates an example circuit simulation of a bit line level shifter, in accordance with some embodiments of the present disclosure.

Based on the similar operation principle discussed with respect to the level shifter C1 (of the control circuit 600 of FIG. 16, the level shifters L1 and L2 can generate a first intermediate signal qgb and a second intermediate signal psvq_i, respectively. For example, the first intermediate signal qgb can be presented with a first logic state corresponding to the supply voltage VQPS or a second logic state corresponding to the fractional voltage HVDD; and the second intermediate signal psvq_i can be presented with a first logic state corresponding to the fractional voltage HVDD or a second logic state corresponding to the fractional voltage LVDD. Similar to the power switch control circuit P1 (of the control circuit 600 of FIG. 6), the power switch control circuit P2 can generate a third intermediate signal PV with its opposite logic states corresponding to the fractional voltage LVDD and a ground voltage, respectively. Alternatively stated, the first intermediate signal qgb can transition within a first voltage domain, from HVDD (e.g., 1.2V) to VQPS (e.g., 1.8V); the second intermediate signal psvq_i can transition within a second voltage domain, from LVDD (e.g., 0.6V) to HVDD (e.g., 1.2V); and the third intermediate signal PV can transition within a third voltage domain, from ground (e.g., 0V) to LVDD (e.g., 0.6V).

The first inverters I10-I13, the second inverters I14-I17, and the third inverters I18-I20 each input the first, second, and third intermediate signals, qgb, psvq_i, and PV, respectively, to collectively determine the voltage level, VDDQ, at the output node N11. For example, to output the signal VDDQ at 1.8V (VQPS), the level shifter L1 provides the intermediate signal qgb at logic low (e.g., 1.2V) and the level shifter L2 provides the intermediate signal psvq_i at logic low (e.g., 0.6V), while the power switch control circuit P2 provides the intermediate signal PV at logic high (e.g., 0.6V). As such, intermediate signals qg2b_i and qg2b_ii can be respectively outputted by the first inverters I10-I13 and the second inverters I14-I17 as logic low, which turns on PMOS transistor M20 (with PMOS transistor M21 being on), turns on PMOS transistor M22 and turns off NMOS transistor M23 (with NMOS transistor M24 being off). Intermediate signal pstb1 can be outputted by the third inverters I18-I20 as logic low, which turns off NMOS transistor M25. Consequently, the supply voltage VQPS (e.g., 1.8V) can be passed to the node N11 as the output signal VDDQ, through the turned-on transistors M20, M21, and M22, while keeping the node N11 decoupled from ground through the turned-off transistors M23, M24, and M25.

On the other hand, to output the signal VDDQ at 0V (ground), the level shifter L1 provides the intermediate signal qgb at logic high (e.g., 1.8V) and the level shifter L2 provides the intermediate signal psvq_i at logic high (e.g., 1.2V), while the power switch control circuit P2 provides the intermediate signal PV at logic low (e.g., 0V). As such, intermediate signals qg2b_i and qg2b_ii can be respectively outputted by the first inverters I10-I13 and the second inverters I14-I17 as logic high, which turns off the PMOS transistor M20, turns off the PMOS transistor M22 and turns on the NMOS transistor M23. The intermediate signal pstb1 can be outputted by the third inverters I8-I18-I20 as logic high, which turns on the NMOS transistor M25. Consequently, the output signal VDDQ can be coupled to the ground voltage, through the turned-on transistors M23, M24, and M25, while keeping the node N11 decoupled from the supply voltage VQPS through the turned-off transistors M20, M21, and M22.

Figure 8:
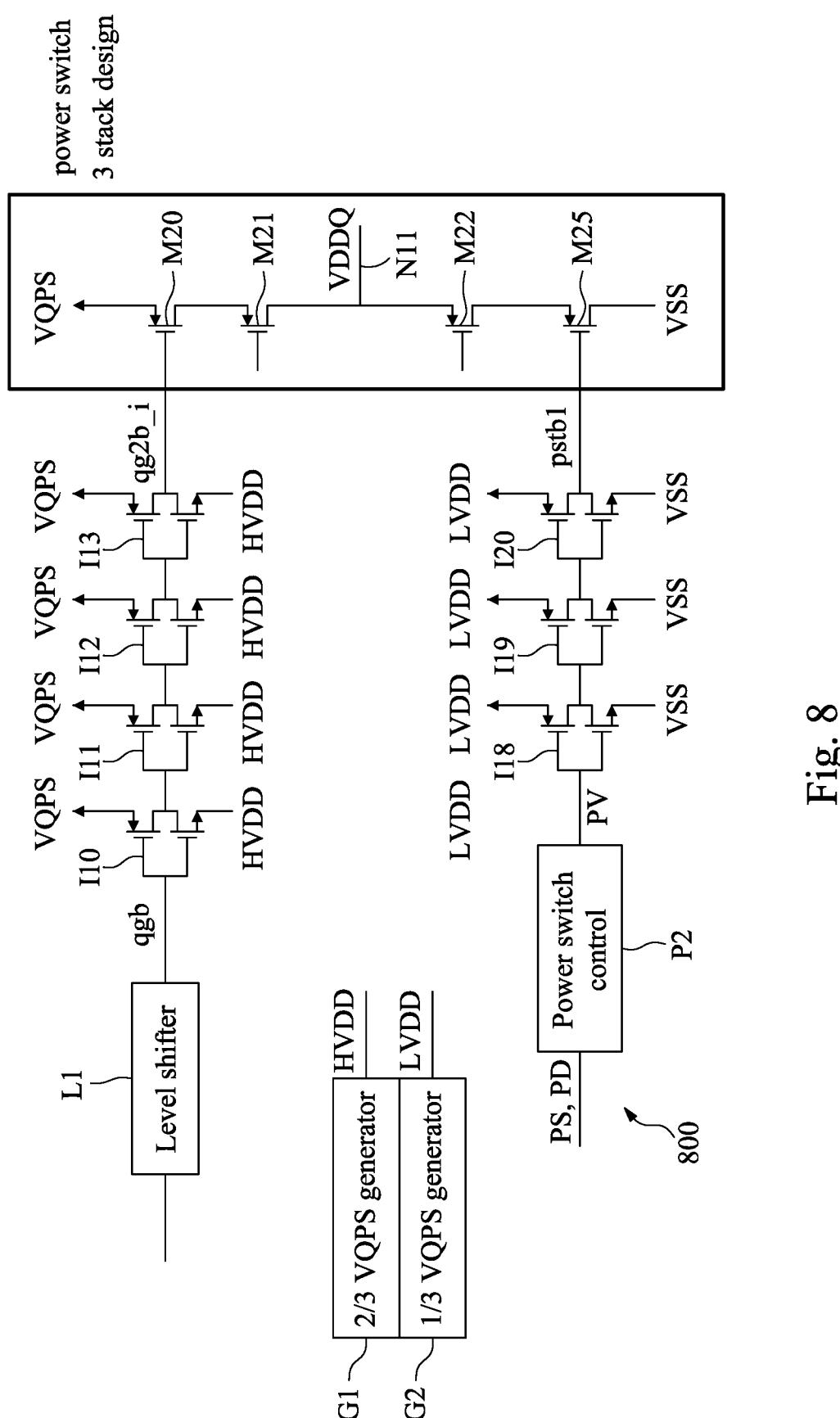
FIG. 8 illustrates an example circuit diagram of a power switch that can be implemented by the control circuit 110 of FIG. 1, in accordance with some embodiments of the present disclosure.

FIG. 8 illustrates an example circuit diagram of a power switch (3 stack design) that can be implemented by the control circuit 110 of FIG. 1, in accordance with some embodiments of the present disclosure. The control circuit 800 is similar to the control circuit 700 (FIG. 7), except that, even with two voltage generators, the control circuit 800 may have one level shifter. As such, the control circuit 800 can also shift an input voltage to a relatively wider voltage domain (compared to the control circuit 600), or each of the transistors of the control circuit 800 can operate with an even lower voltage stress (compared to the control circuit 600). Thus, the following discussions of control circuit 800 will be focused on the difference. In FIG. 8, stacking transistors reduces the VQPS stress (e.g., ⅓ VQPS stress) on each individual transistor within the power switch.

For example, the control circuit 800 may include first and second fractional voltage generators G1 and G2, one voltage level shifter L1, a power switch control circuit P2, and a first set of serially coupled inverters I10, I11, I12, and I13, and a second set of serially coupled inverters I18, I19, and I20. The voltage generators G1 and G2 can provide a first fractional voltage HVDD and a second fractional voltage LVDD, respectively. In some embodiments, the supply voltage VQPS (received by the control circuit 800) can be about 1.8V, while the fractional voltage HVDD is about two thirds of VQPS, i.e., about 1.2V, and the fractional voltage LVDD is about one third of VQPS, i.e., about 0.6V. The HVDD and LVDD can power the level shifters L1 and L2, respectively.

Based on the similar operation principle discussed with respect to the level shifter C1 (of the control circuit 600 of FIG. 6), the level shifter L1 can generate a first intermediate signal qgb based on the fractional voltage HVDD. For example, the first intermediate signal qgb can be presented with a first logic state corresponding to the supply voltage VQPS or a second logic state corresponding to the fractional voltage HVDD. Similar to the power switch control circuit P1 (of the control circuit 600 of FIG. 6), the power switch control circuit P2 can generate a second intermediate signal PV with its opposite logic states corresponding to the fractional voltage LVDD and a ground voltage, respectively. Alternatively stated, the first intermediate signal qgb can transition within a first voltage domain, from HVDD (e.g., 1.2V) to VQPS (e.g., 1.8V); and the second intermediate signal PV can transition within a second voltage domain, from ground (e.g., 0V) to LVDD (e.g., 0.6V).

The first inverters I10-I13 and the second inverters I18-I20 each input the first and second intermediate signals, qgb and PV, respectively, to collectively determine the voltage level, VDDQ, at the output node N11. For example, to output the signal VDDQ at 1.8V (VQPS), the level shifter L1 provides the intermediate signal qgb at logic low (e.g., 1.2V), while the power switch control circuit P2 provides the intermediate signal PV at logic high (e.g., 0.6V). As such, intermediate signals qg2b_i can be outputted by the first inverters I10-I13 as logic low, which turns on PMOS transistor M20 (with PMOS transistor M21 being on). Intermediate signal pstb1 can be outputted by the third inverters I18-I20 as logic low, which turns off NMOS transistor M25. Consequently, the supply voltage VQPS (e.g., 1.8V) can be passed to the node N11 as the output signal VDDQ, through the turned-on transistors M20 and M21, while keeping the node N11 decoupled from ground through the turned-off transistor M25.

On the other hand, to output the signal VDDQ at 0V (ground), the level shifter L1 provides the intermediate signal qgb at logic high (e.g., 1.8V), while the power switch control circuit P2 provides the intermediate signal PV at logic low (e.g., 0V). As such, intermediate signals qg2b_i can be outputted by the first inverters I10-I13 as logic high, which turns off the PMOS transistor M20. The intermediate signal pstb1 can be outputted by the third inverters I18-I20 as logic high, which turns on the NMOS transistor M25. Consequently, the output signal VDDQ can be coupled to the ground voltage, through the turned-on transistors M22 and M25, while keeping the node N11 decoupled from the supply voltage VQPS through the turned-off transistor M20.

Figure 9:
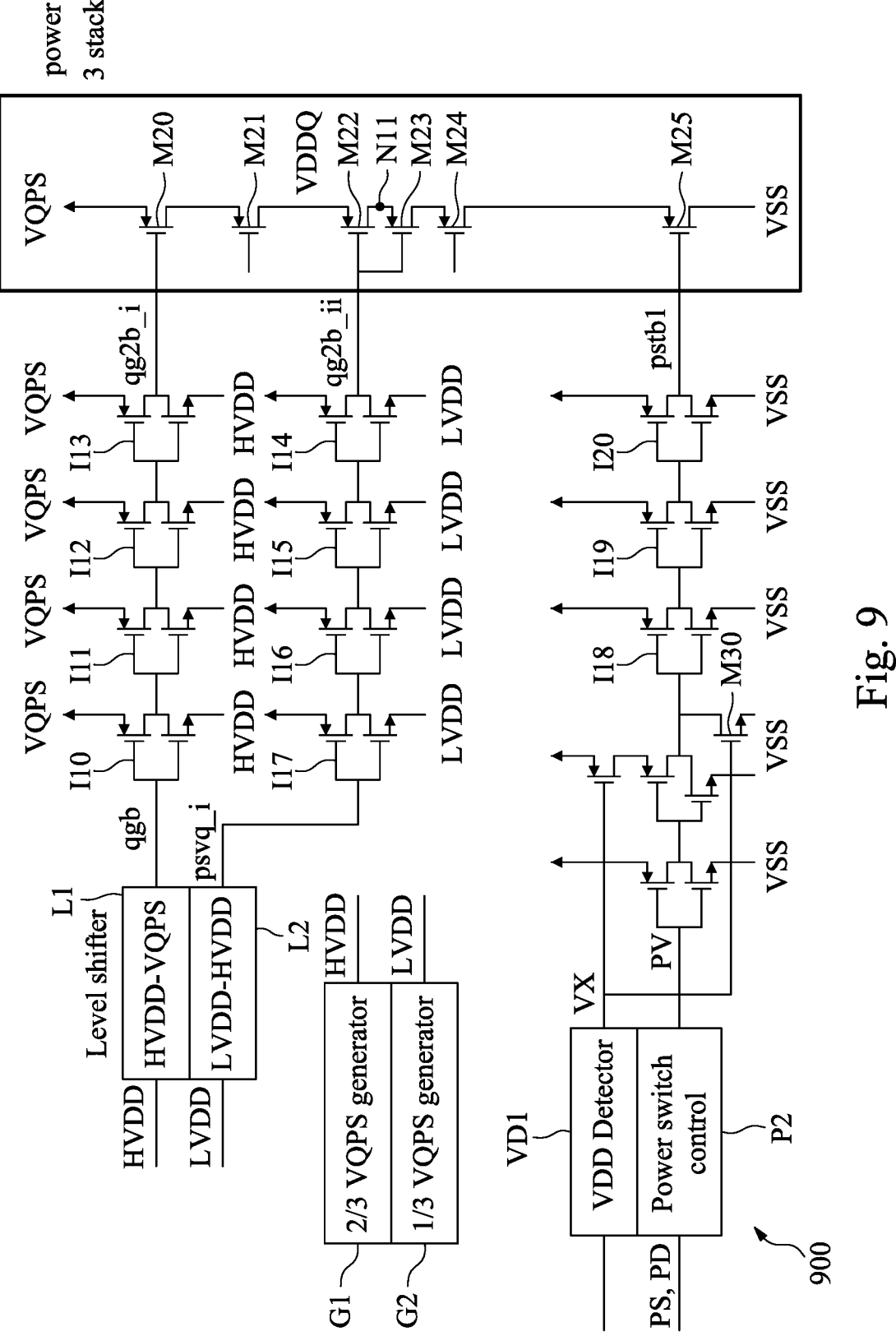
FIG. 9 illustrates an example circuit diagram of a power switch that can be implemented by the control circuit 110 of FIG. 1, in accordance with some embodiments of the present disclosure.

FIG. 9 illustrates an example circuit diagram of a power switch that can be implemented by the control circuit 110 of FIG. 1, in accordance with some embodiments of the present disclosure. The control circuit 900 is similar to the control circuit 700 (FIG. 7), except that the control circuit 900 may further include a voltage detector. As such, the control circuit 900 can also shift an input voltage to a relatively wider voltage domain (compared to control circuit 600), or each of the transistors of the control circuit 900 can operate with an even lower voltage stress (compared to the control circuit 600). Thus, the following discussions of control circuit 900 will be focused on the difference. In FIG. 9, stacking transistors reduces the VQPS stress (e.g., ⅓ VQPS stress) on each individual transistor within the power switch.

In various embodiments, the control circuit 900 may include a voltage detector VD1 configured to detect whether a relatively low logic voltage VDD, driving the control signals (e.g., YSELB, YSELB', PS, PD, etc.), is ready or otherwise stable when compared to the supply voltage VQPS. For example, if VDD is not ready while supply voltage VQPS has been provided, the voltage detector VD1 can forcibly pull the output signal VDDQ to ground. In some embodiments, the voltage detector VD1, which is essentially comprised of a number of inverters with relatively weak PMOS transistors, can output another intermediate signal Vx based on comparing a voltage level of the logic voltage VDD with a voltage level of the supply voltage VQPS. In response to determining that VDD is not ready, the voltage detector VD1 outputs the intermediate signal Vx at logic high. As such, regardless of the intermediate signal PV being outputted as a logic high or low, the inverter I18 can receive a logic low, which is pulled to the ground voltage by NMOS transistor M30 that is turned on by the high Vx. Consequently, the intermediate signal pstb1 can be outputted at logic high, which turns on the NMOS transistor M25 to pull the output signal VDDQ to ground.

Figure 10:
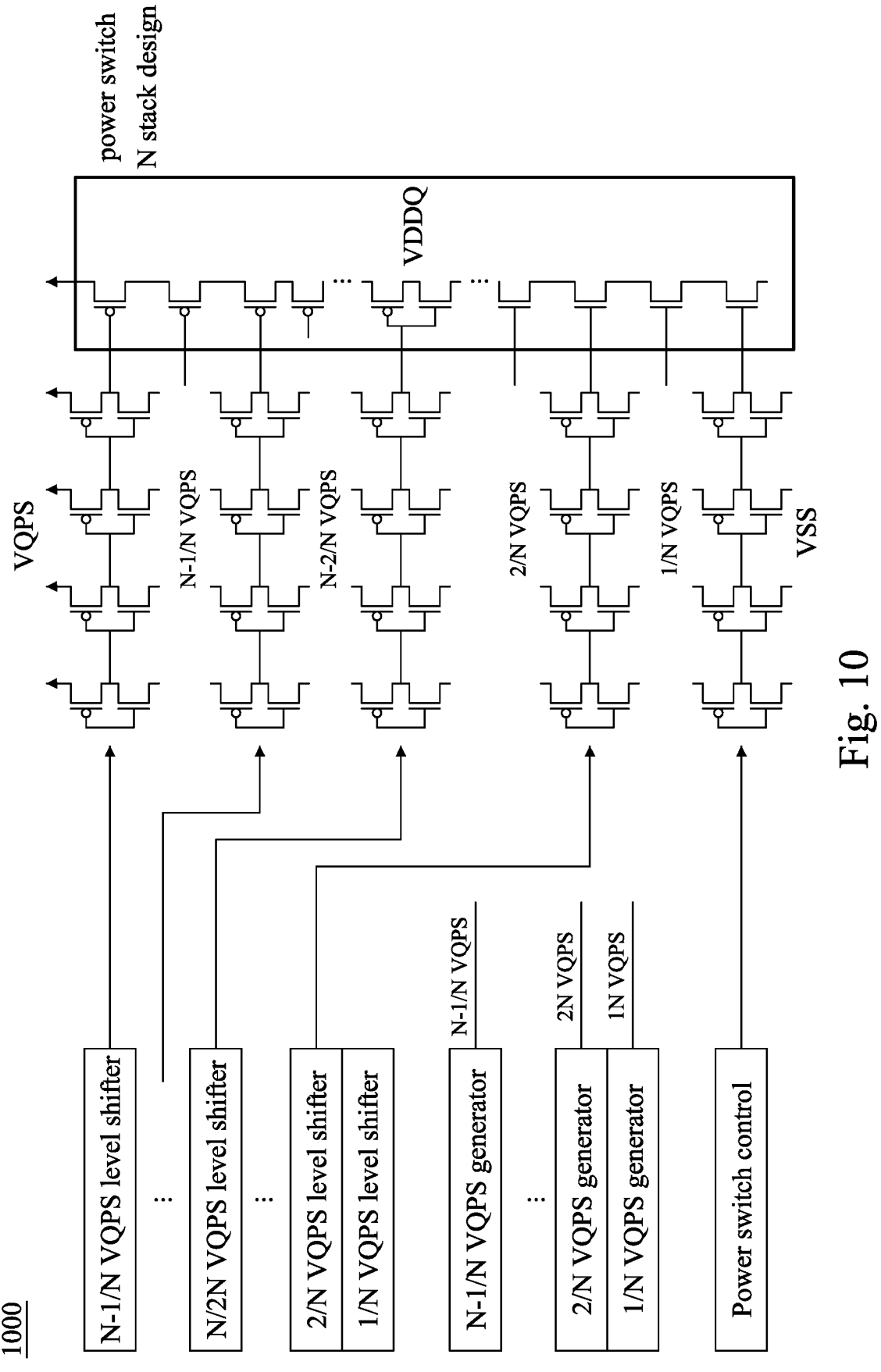
FIG. 10 illustrates an example circuit diagram of a power switch that can be implemented by the control circuit 110 of FIG. 1, in accordance with some embodiments of the present disclosure.

FIG. 10 illustrates an example circuit diagram of a power switch (N stack design) that can be implemented by the control circuit 110 of FIG. 1, in accordance with some embodiments of the present disclosure. The control circuit 1000 is similar to the control circuit 700 (FIG. 7), except for the N voltage generators and the N level shifters. The control circuit 1000 may include N voltage generators, N level shifters, and a power switch control. By using the N voltage generators and N level shifters, the control circuit 1000 reduces the VQPS stress (e.g., 1/N VQPS stress) on each individual transistor within the power switch.

Figure 11:
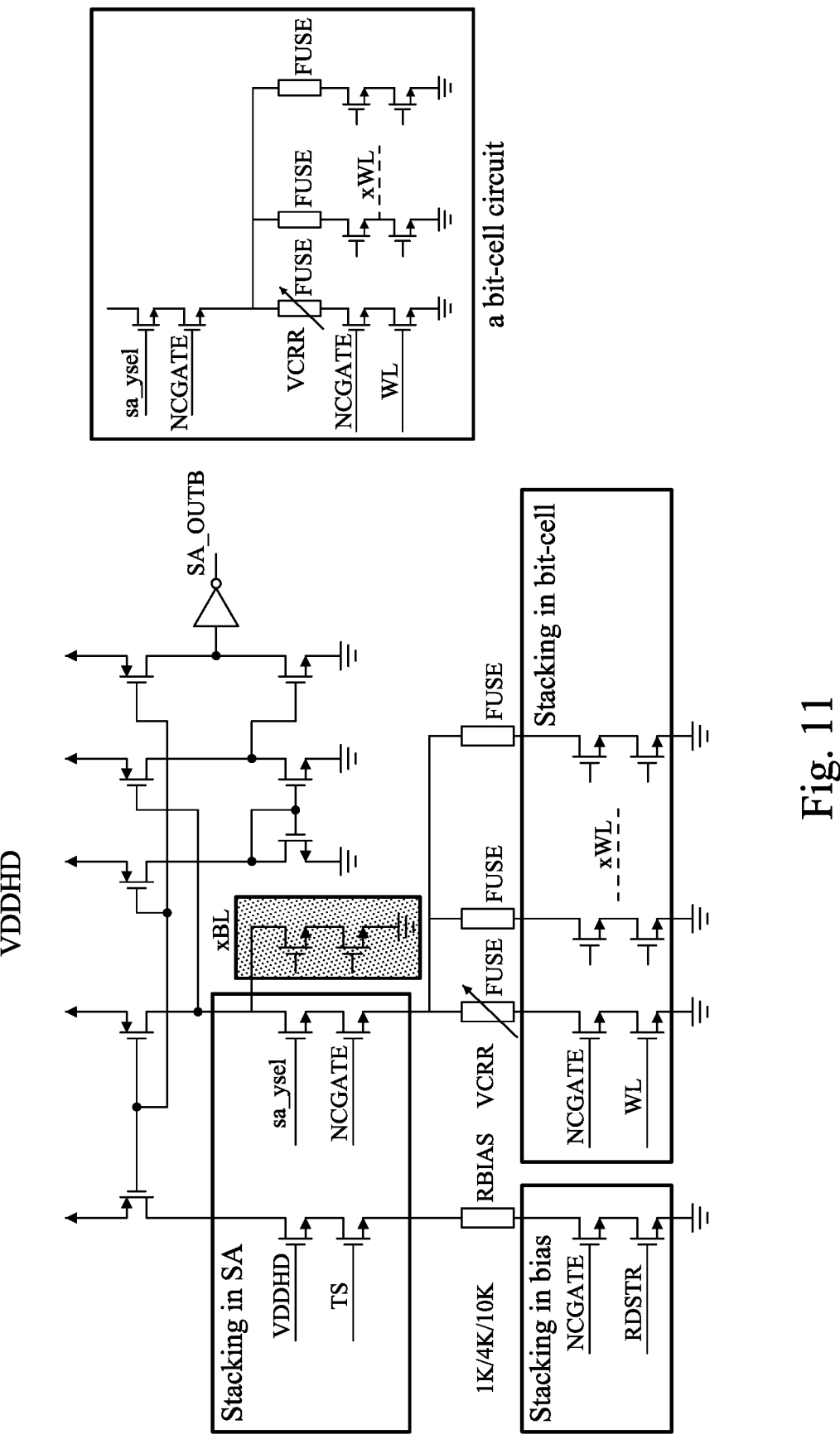
FIG. 11 illustrates an example circuit diagram of a sense amplifier that can be implemented by the control circuit 110 of FIG. 1, in accordance with some embodiments of the present disclosure.

FIG. 11 illustrates an example circuit diagram of a sense amplifier that can be implemented by the control circuit 110 of FIG. 1, in accordance with some embodiments of the present disclosure. The control circuit 1100 is similar to the control circuit 110 (FIG. 1), except for the stacking circuits in the sensing amplifier, the stacking circuits in the bias, the stacking circuits in the bit-cell. For instance, the sensing amplifier can be realized using two stacked circuits. To prevent leakage, the VDDHD may not equal to 0. In the configuration, there can be a number of bit lines (xBL) bit-cell circuits connected in series, and within each bit-cell circuit. There can be a number of word lines (xWL) bit-cells also connected in series. In various embodiments, such a fractional voltage can allow each of transistors in FIG. 11 to operate under a relatively low voltage stress, e.g., under 0.96V. As such, each of the transistors, regardless of being implemented as NMOS or PMOS, can be implemented as a core device with a relatively thin gate dielectric while being immune from high voltage stress.

Figure 12:
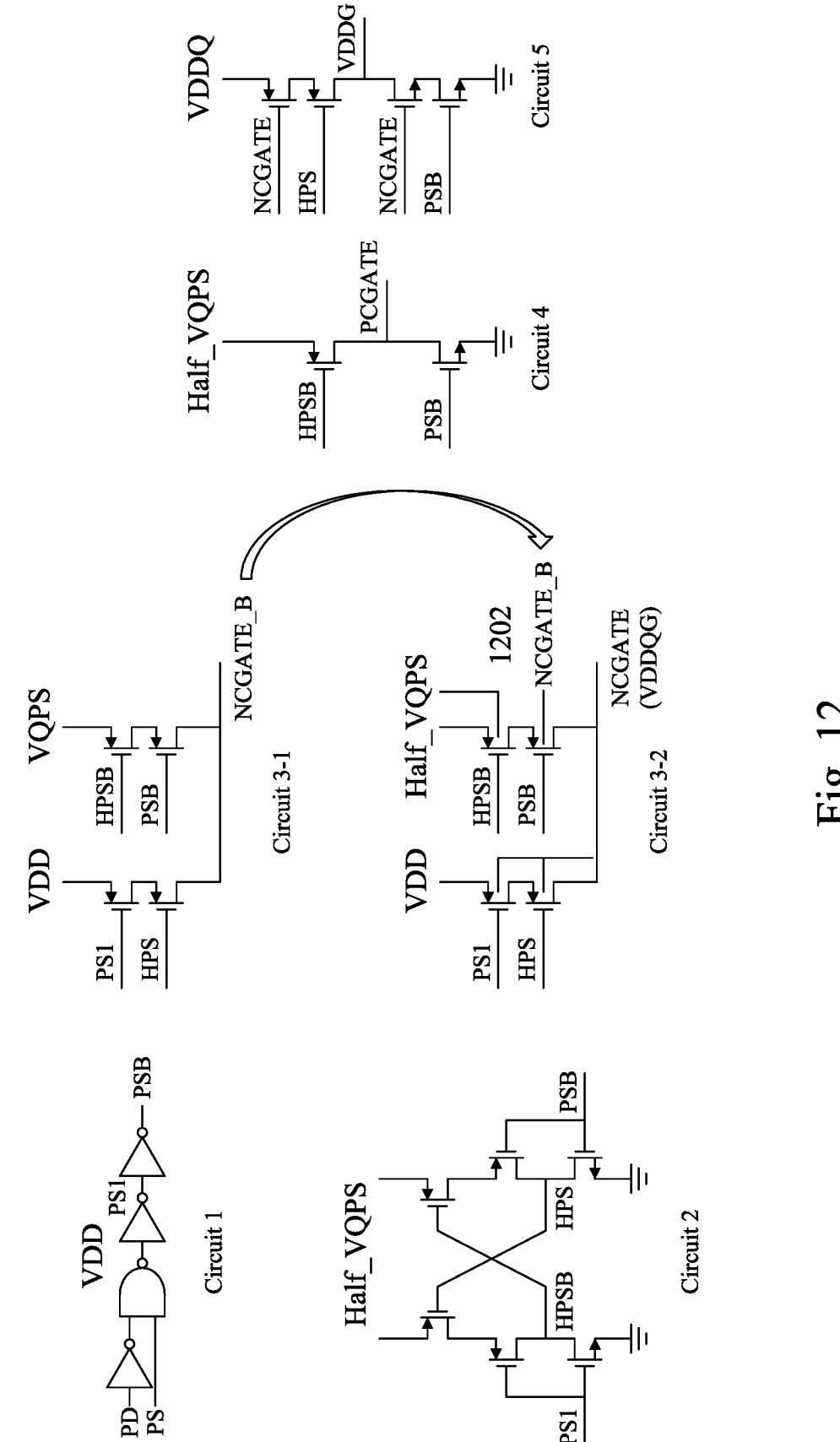
FIG. 12 illustrates an example circuit diagram of a half power switch that can be implemented by the control circuit 110 of FIG. 1, in accordance with some embodiments of the present disclosure.

FIG. 12 illustrates an example circuit diagram of a half power switch 318 that can be implemented by the control circuit 110 of FIG. 1, in accordance with some embodiments of the present disclosure. The half power switch 318 may include multiple circuits (e.g., circuit 1 to circuit 5). The half power switch 318 can be responsible for generating both a first gate control signal NCGATE 350 and a second gate control signal PCGATE 352, which are used in both read and program modes. The circuit 1 can be designed as a control circuit tasked with managing the PSB signal, which serves as an input signal for circuits 2, 3, 4, and 5. In some embodiments, the circuit 2 can function as a level shifter, converting signals from PSB to HPS and from PSI to HPSB, for instance.

The circuits 3-1 and 3-2 can serve as half power switches in various embodiments. The circuit 3 can be configured to generate the voltage for the first gate control signal NCGATE based on the program or read mode. The circuit 3 may receive both a supply voltage VDDHD and a supply voltage Half_VQPS. For instance, the supply voltage Half_VQPS can be set at about 0.9V and the supply voltage VDDHD can be configured at about 0.75V. During the read mode (e.g., PS=L), the first gate control signal NCGATE 350 can be adjusted to approximately 0.75V. During the program/write mode (e.g., PS=H), the first control signal NCGATE 350 can be set to roughly 0.9V. In some embodiments, the NCGATE_B 1202 in circuit 3-2 can function as a power switch. The NCGATE_B 1202 may help prevent forward bias in certain modes when Half_VQPS is at 0 or floating.

In some embodiments, the circuit 4 can be configured to generate a voltage for the second gate control signal PCGATE based on the program or read mode. The circuit 4 may receive a supply voltage Half_VQPS, which can be set at about 0.9V. During the read mode (e.g., PS=L), the second control signal PCGATE 352 can be set to about 0V. During the program/write mode (e.g., PS=H), the second gate control signal PCGATE 352 can be set to approximately 0.9V. In some embodiments, the circuit 5 can function as a power switch. The circuit 5 may receive a supply voltage VDDQ and may generate a supply voltage VDDG. The supply voltage VDDG is then supplied to a BL level shifter. In the BL level shifter, the supply voltage VDDG can be utilized to turn off/deactivate the VDD domain. The supply voltage VDDG can be either equal to the supply voltage VDDQ or set to 0V.

Figure 13:
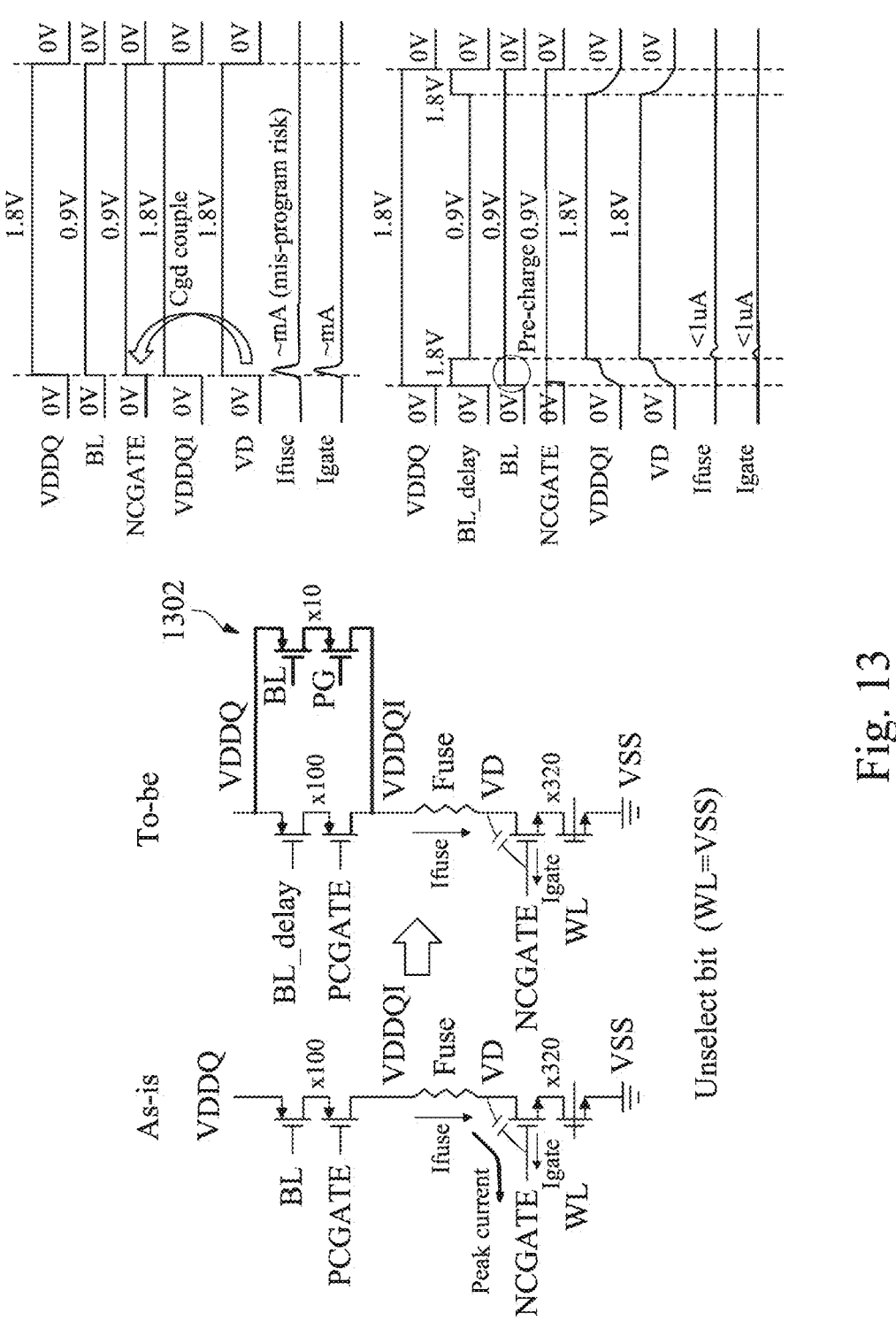
FIG. 13 illustrates an example circuit diagram of a bit line trassgate that can be implemented by the control circuit 110 of FIG. 1, in accordance with some embodiments of the present disclosure.

FIG. 13 illustrates an example circuit diagram of a bit line (BL) trassgate 306 that can be implemented by the control circuit 110 of FIG. 1, in accordance with some embodiments of the present disclosure. The BL trassgate 306 of FIG. 13 is substantially similar to the BL trassgate 306 of FIG. 3, except for the delay circuit 1302. Accordingly, the following discussion of the BL trassgate 306 will be focused on the difference. In the absence of the delay circuit 1302, the Ifuse operation may lead to a peak current in the EFCELL 312. To mitigate this issue, the delay circuit 1302 is designed to introduce a delay in the memory circuit 100, preventing a surge in current within the effuse circuit. Through the implementation of the delay circuit 1302, the smaller circuit (e.g., ×10) 1302 is activated prior to the main circuit (e.g., larger circuit, ×100) for the BL trassgate 306. The waveforms of signals, including voltage levels at Ifuse and Igate, illustrate how this approach effectively mitigates the risk of misprogramming.

Figure 14:
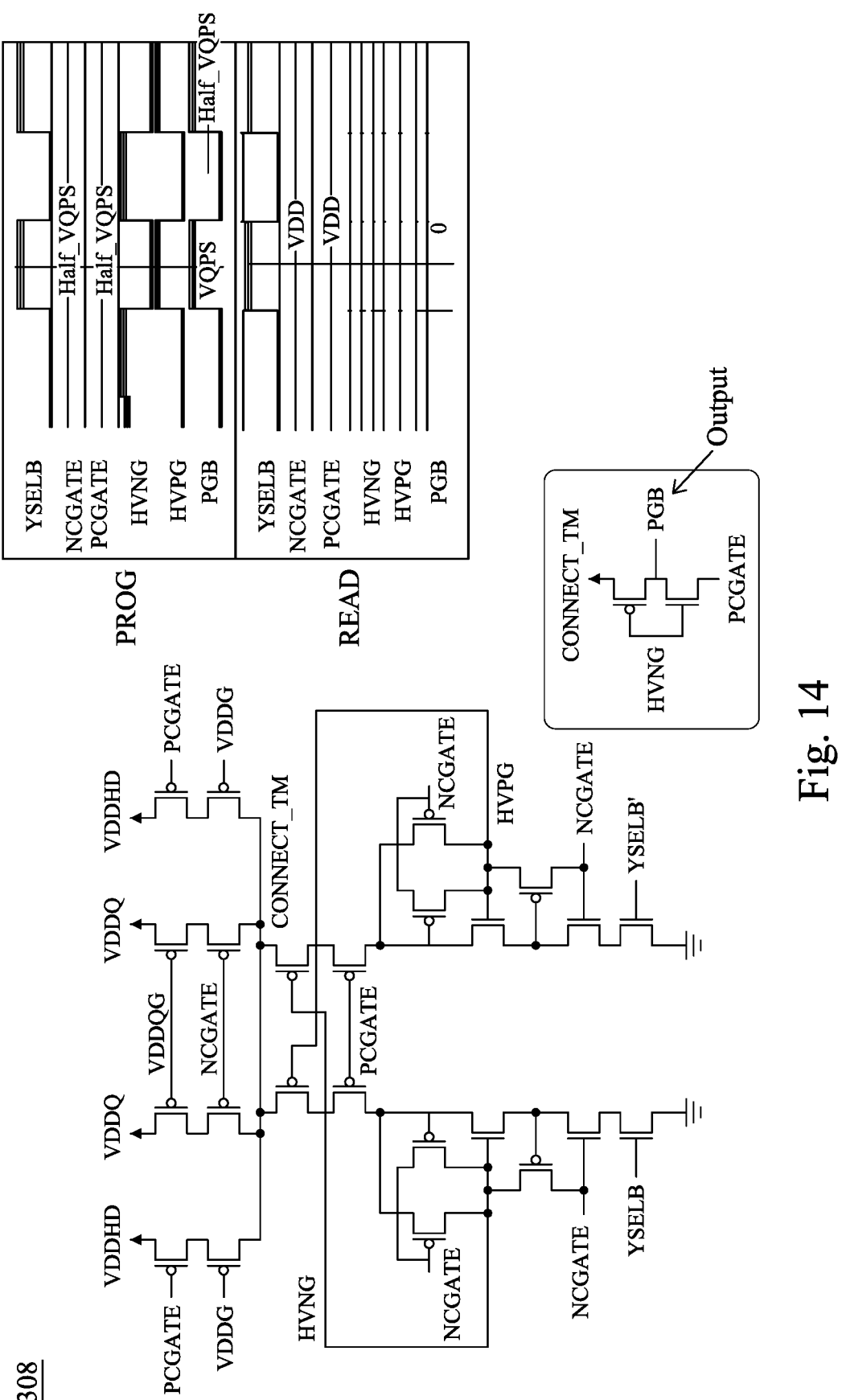
FIG. 14 illustrates an example circuit diagram of a bit line level shifter that can be implemented by the control circuit 110 of FIG. 1, in accordance with some embodiments of the present disclosure.

FIG. 14 illustrates an example circuit diagram of a bit line (BL) level shifter 308 that can be implemented by the control circuit 110 of FIG. 1, in accordance with some embodiments of the present disclosure. The BL level shifter 308 may comprise a plurality of p-type transistors electrically stacked with respect to one another. The BL level shifter 308 may receive a supply voltage VDDHD (e.g., about 0.75 V) and a supply voltage VDDQ (e.g., about 1.8 V). In some embodiments, the BL level shifter 308 can be configured to shift voltage from a first voltage domain (e.g., about 0~0.75V) to a second voltage domain (e.g., about 0.9~1.8V) for the BL control circuit 306. The first voltage domain can be ranging from the third supply voltage (e.g., about 0V) to the second supply voltage (e.g., about 0.75V).

The second voltage domain can be ranging from the first fraction of the first supply voltage (e.g., about 0.9V) to the first supply voltage (e.g., about 1.8V).

In certain embodiments, the BL level shifter 308 can be supplied with the supply voltage VDDG from the half power switch 318. The VDDG voltage can be configured to shift the voltage domain to either the first voltage domain, typically ranging from about 0 to 0.75V, or the second voltage domain, typically within the range of about 0.9 to 1.8V. This supply voltage, VDDG, has the capability to deactivate or turn off the VDD domain. The supply voltage VDDG can either be equivalent to the supply voltage VDDQ or set to 0V. For example, when the VDDG supply voltage is set at 1.8V, it results in the deactivation of the VDDHD domain.

Figure 15:
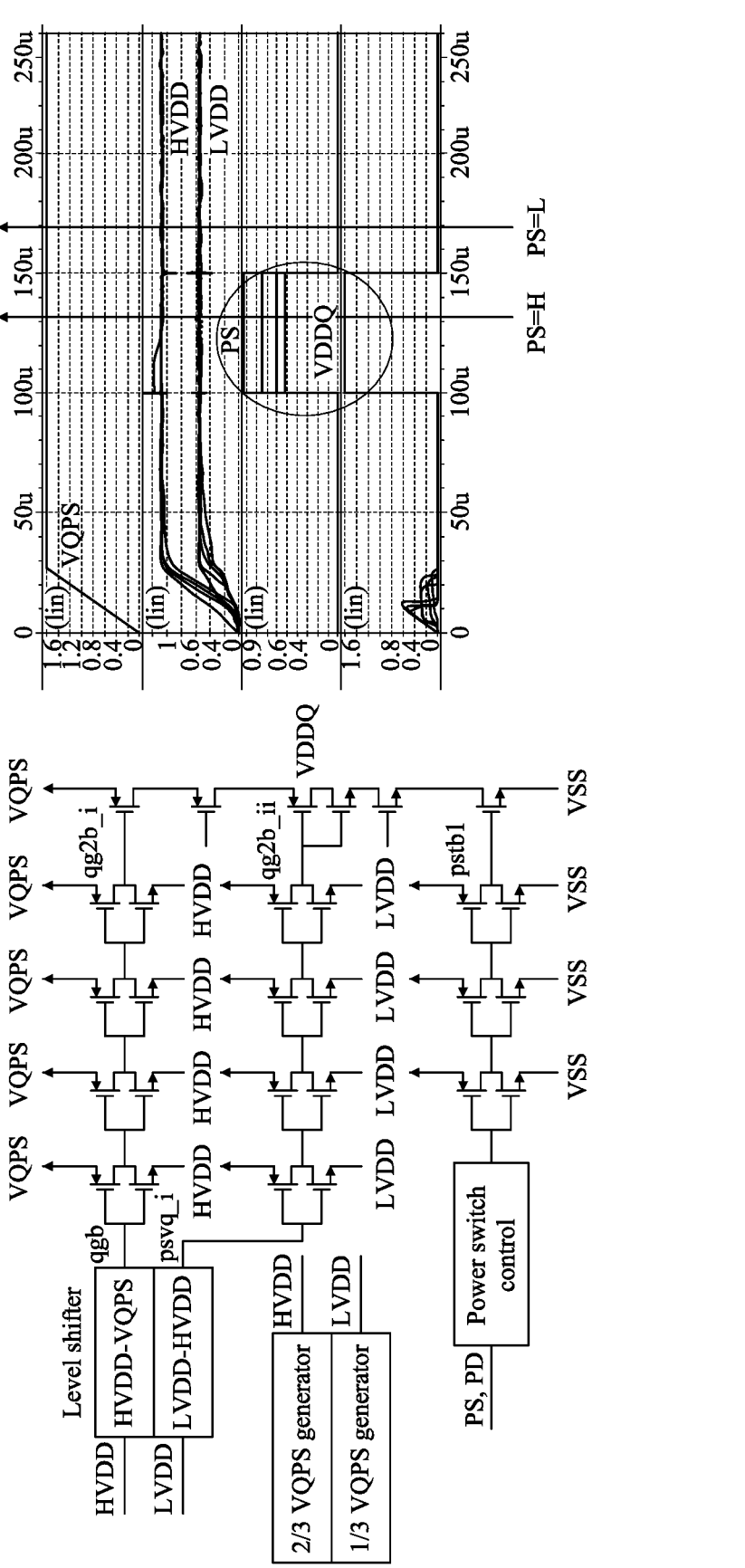
FIG. 15 illustrates an example circuit simulation of a memory circuit 100, in accordance with some embodiments of the present disclosure.

FIG. 15 illustrates an example circuit simulation of a memory circuit 100, in accordance with some embodiments of the present disclosure. FIG. 15 illustrate respective waveforms of signals (e.g., voltage levels) over time. For example in FIG. 15, control signal PS and output signal VDDQ are shown. Each of the signals is a pulse signal transitioning between a low logic state (which corresponds to the lower bound of a corresponding voltage domain) and a high logic state (which corresponds to the higher bound of a corresponding voltage domain). Specifically, PS may each transition between a logic low (e.g., about 0V) and a logic high (e.g., about 0.75V) and VDDQ may transition between a logic low (e.g., about 0V) and a logic high (e.g., about 1.8V). As a non-limiting example, when PS is at high, the output signal VDDQ can be equal to about 1.8V (VQPS); and when PS is at low, the output signal VDDQ can be equal to about 0V (ground). The VDDQ signal can remain stable even as the PS signal varies.

FIG. 16 illustrates an example circuit diagram of another voltage level shifter C2, in accordance with various embodiments. The voltage level shifter C2 is similar to the voltage level shifter C1 (FIG. 6) with some connections among the NMOS transistors M9 and M10 being changed. Thus, the following discussions will be focused on the difference. As shown, the gate of the NMOS transistor M10 is connected to the gate of the PMOS transistor M8, rather than being connected to the source of the PMOS transistor M8 (FIG. 6). Similarly, the gate of the NMOS transistor M9 is connected to the gate of the PMOS transistor M7, rather than being connected to the source of the PMOS transistor M7 (FIG. 6). In such case, the gate of the NMOS transistor M9 and the gate of the NMOS transistor M10 may have better gate bias.

Figure 17:
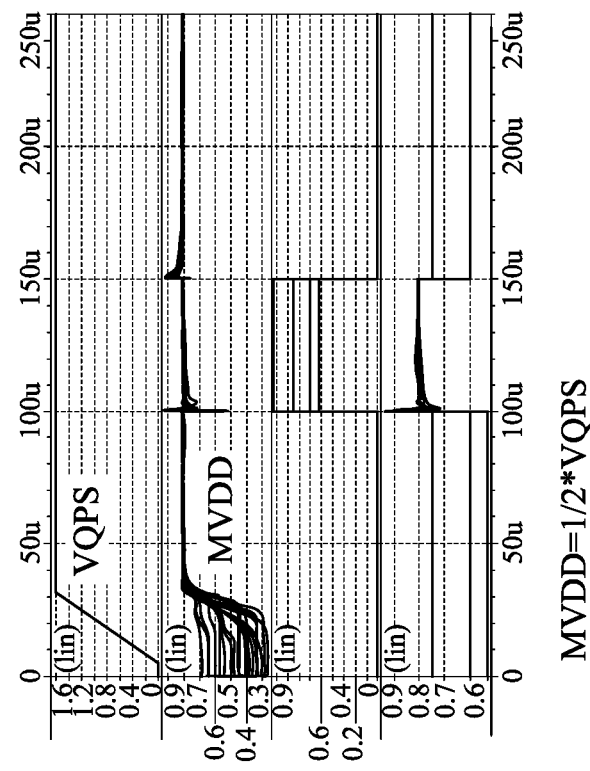
FIG. 17 illustrates an example circuit diagram of a fractional voltage generator that can be implemented by the control circuit 110 of FIG. 1, in accordance with some embodiments of the present disclosure.
Figure 17:
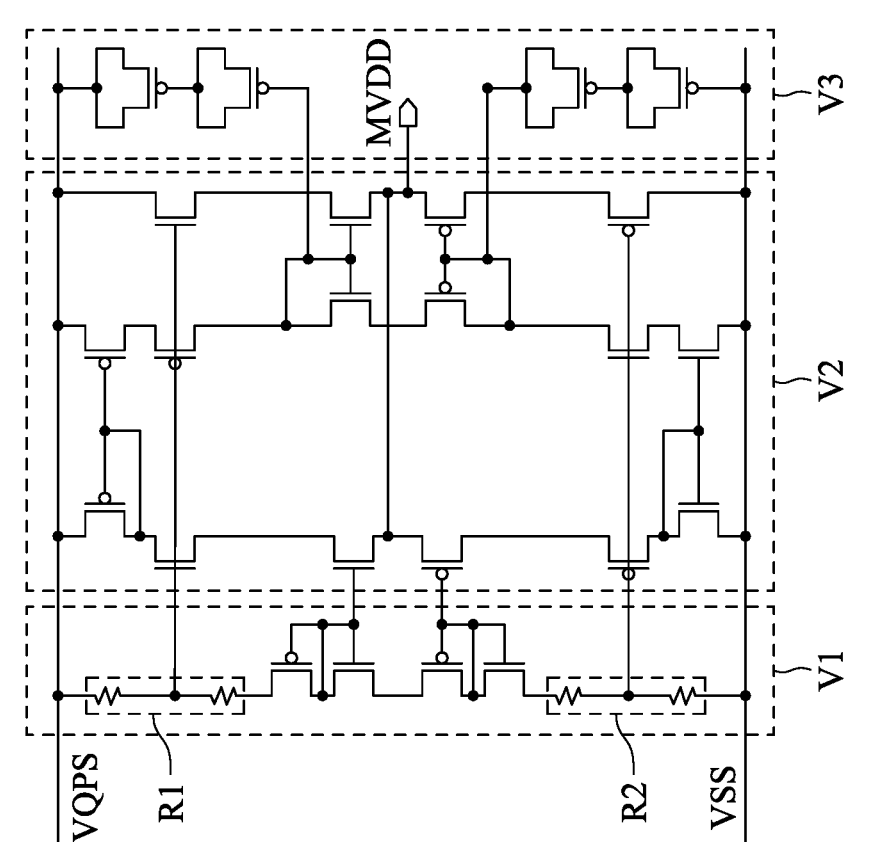

FIG. 17 illustrates an example circuit diagram of a voltage generator 316, which can be one of various implementations of the MVDD generator 316 (FIG. 3). The MVDD generator 316 can generate a fractional voltage (e.g., MVDD) based on a supply voltage (e.g., VQPS) and a ground voltage (e.g., VSS).

As shown, the MVDD generator 316 may include a first section V1, a second section V2, and a third section V3. The first section V1 may serve as a power divider, the second section V2 may serve as a push/pull driver, and the third section V3 may be configured to stabilize the output, i.e., the fractional voltage MVDD. In some embodiments, the first section V1 may include two sets of resistors R1 and R2, a number of NMOS transistors, and a number of PMOS transistors that are configured to collectively generate a bias; the second section V2 includes a number of NMOS transistors and a number of PMOS transistors that are configured to collectively pull or push the output; and the third section V3 includes a number of MOS capacitors that are configured to collectively stabilize the output. In some other embodiments, each of the resistors may be implemented as a MOS diode, while remaining within the scope of the present disclosure. Generally, the fractional voltage MVDD is equal to a ratio of the first set of resistors R1 to the second set of resistors R2, multiplied by the supply voltage VQPS:

$$MVDD = N \times VQPS$$

where coefficient N is defined as:

$$R2/(R1 + R2)$$

For example, when R1/R2 is equal to 1, N is equal to ½. As such, MVDD is equal to ½×VQPS. In another example, when R1/R2 is equal to ½, N is equal to ⅔. As such, MVDD is equal to ⅔×VQPS. When R1/R2 is equal to two, N is equal to ⅓. As such, MVDD is equal to ⅓×VQPS.

Figure 18:
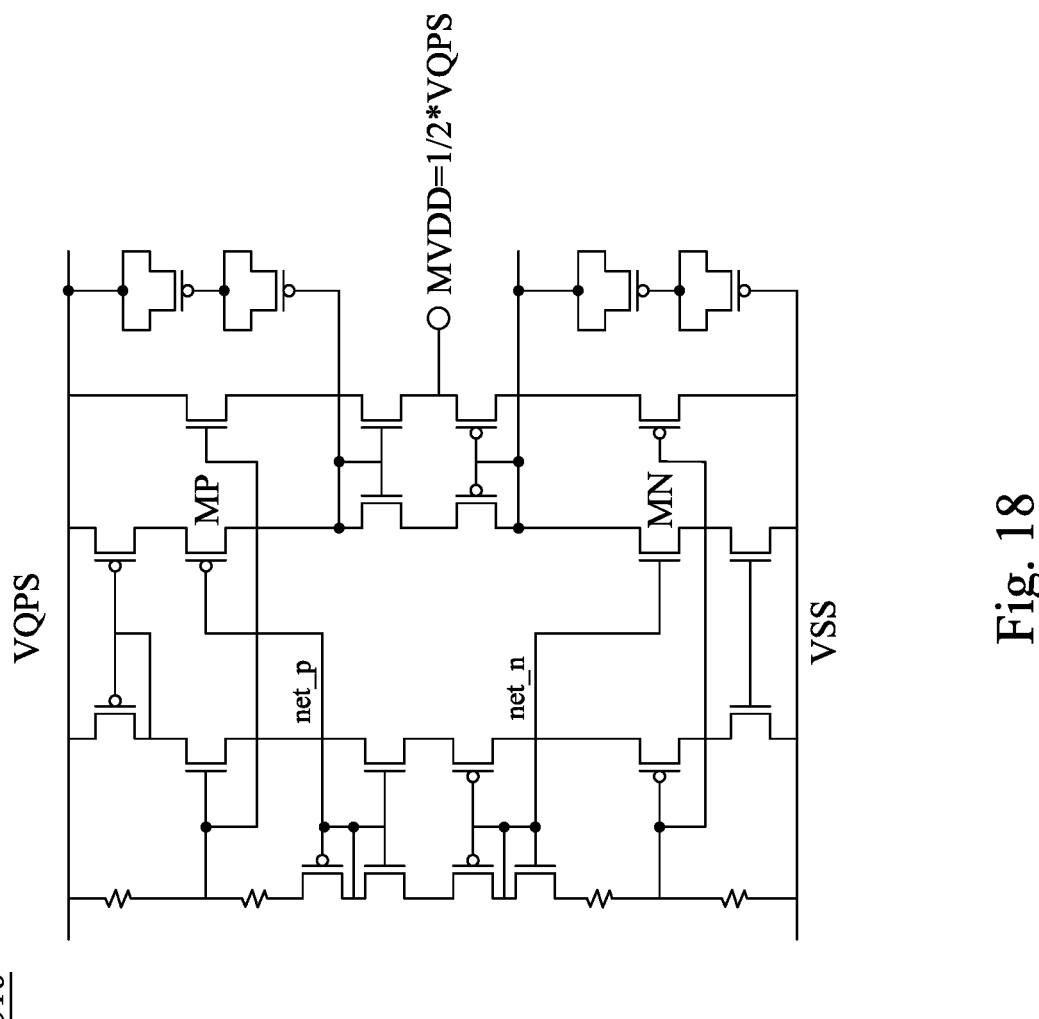
FIG. 18 illustrates an example circuit diagram of a fractional voltage generator that can be implemented by the control circuit 110 of FIG. 1, in accordance with some embodiments of the present disclosure.

FIG. 18 illustrates an example circuit diagram of another fractional voltage generator that can be implemented by the control circuit 110 of FIG. 1, in accordance with some embodiments of the present disclosure. The MVDD generator 316 of FIG. 18 is substantially similar to the MVDD generator 316 of FIG. 17, except for the MP/MN bias. The MP bias can be connected to the net net_p. The MN bias can be connected to the net net_n. The MP/MN bias can function as a low voltage supply MVDD generator bias. As such, MVDD is equal to ½×VQPS.

Figure 19:
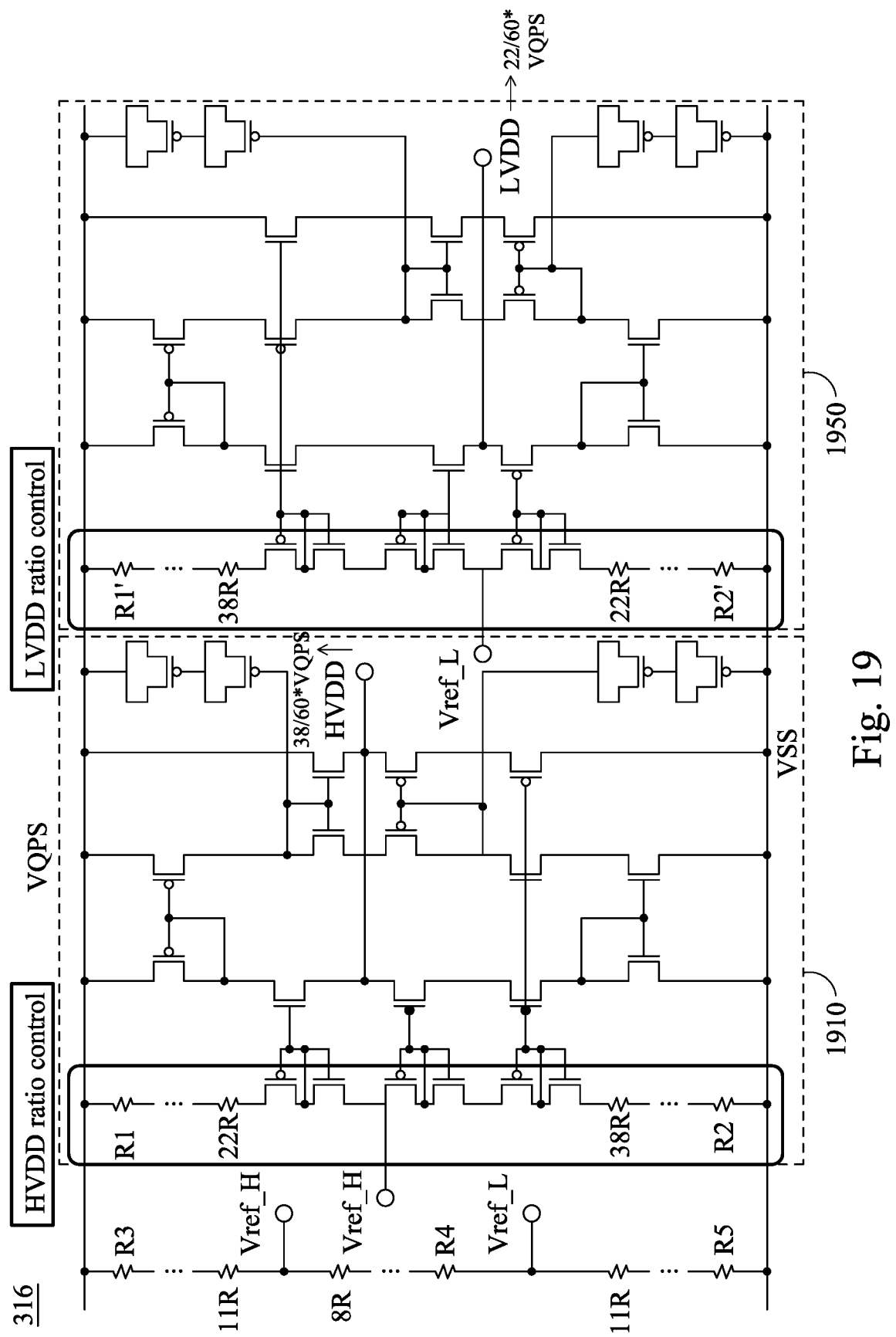
FIG. 19 illustrates an example circuit diagram of a fractional voltage generator that can be implemented by the control circuit 110 of FIG. 1, in accordance with some embodiments of the present disclosure.

FIG. 19 illustrates an example circuit diagram of a MVDD generator 316 that can be implemented by the control circuit 110 of FIG. 1, in accordance with some embodiments of the present disclosure. FIG. 19 illustrates an example circuit diagram of a MVDD generator 316, which can be one of various implementations of a combination of the voltage generators G1 and G2 (FIGS. 7, 8, and 9). The MVDD generator 316 can generate multiple fractional voltages (e.g., HVDD and LVDD) based on a supply voltage (e.g., VQPS) and a ground voltage (e.g., VSS). The MVDD generator 316 is similar to the MVDD generator 316 in FIG. 17, and thus, the following discussion of the MVDD generator 316 will be focused on the difference.

As shown, the MVDD generator 316 includes a combination of two voltage generators 1910 and 1950, each of which is similar to the MVDD generator 316 in FIG. 17 (e.g., including three sections operatively coupled to each other). For example, the voltage generator 1910 can provide a first fractional voltage HVDD based on a ratio of first set of resistors R1 to a second set of resistors R2, multiplied by the supply voltage VQPS; and the voltage generator 1950 can provide a second fractional voltage LVDD based on a ratio of first set of resistors R1' to a second set of resistors R2', multiplied by the supply voltage VQPS. As a non-limiting example, the ratio of R1 to R1+R2 (22 to 60) may be around 0.36 and the ratio of R2 to R1+R2 (38 to 60) may be around 0.63, which causes the outputs HVDD and LVDD to be around 0.6V and 1.2V, respectively (when VQPS=1.8V). Further, the MVDD generator 316 may include a voltage divider, also coupled between the supply voltage VQPS and ground voltage, to provide reference voltages Vref_H and Vref_L to the voltage generators 1910 and 1950, respectively. In some embodiments, the voltage divider can include three sets of resistors R3, R4, and R5. Continuing with the above example, a ratio of the these three sets of resistors R3 to R4 to R5 may be 11:8:11.

FIG. 20 illustrates a flowchart of an example method 2000 for operating a memory circuit with stacking circuits, in accordance with some embodiments of the present disclosure. It is noted that the method 2000 is merely an example, and is not intended to limit the present disclosure. Accordingly, it is understood that any additional operations may be provided during, before, and after the method 2000 of FIG. 20, and that some other operations may only be briefly described herein. The method 2000 may be utilized to operate the control circuit 110, and thus, operations of the method 2000 will be discussed in conjunction with the components discussed in FIGS. 1-19.

In brief overview, the method 2000 starts with operation 2002 of receiving a first supply voltage and a second supply voltage. The method 2000 continues to optional operation 2004 of providing, based on the first supply voltage and the second supply voltage, a first gate control signal to a plurality of first transistors of a memory circuit and a second gate control signal to a plurality of second transistors of the memory circuit. The method 2000 continues to operation 2006 of configuring, when writing a memory cell of the memory circuit, the first gate control signal to be equal to a fraction of the first supply voltage and the second control signal to be equal to the fraction of the first supply voltage. The method 2000 continues to operation 2008 of configuring, when reading the memory cell of the memory circuit, the first gate control signal to be equal to the fraction of the first supply voltage and the second control signal to be equal to a third supply voltage lower than any of the first or second supply voltage. In various embodiments, the first supply voltage is substantially higher than two times the second supply voltage.

Corresponding to operation 2002 of FIG. 20, a first supply voltage 360 and a second supply voltage 362 can be received by a memory circuit 100. For example in FIG. 3, the power management circuit 112 may receive an supply voltage VQPS and a supply voltage VDD. The supply voltage VQPS is substantially higher than two times the supply voltage VDD. For example, the supply voltage VQPS can be equal to about 1.8V and the supply voltage VDD can be equal to about 0.75V.

Corresponding to optional operation 2004 of FIG. 20, a first gate control signal to a plurality of first transistors of a memory circuit and a second gate control signal to a plurality of second transistors of the memory circuit can be provided based on the first supply voltage and the second supply voltage. For example in FIG. 3, the power management circuit 112 may provide a first gate control signal NCGATE 350 and a second gate control signal PCGATE 352 based on the supply voltage VQPS and the supply voltage VDD. The first gate control signal NCGATE 350 can be configured to control a plurality of first transistors (e.g., BL select 306) of the memory circuit 100. The second gate control signal PCGATE 352 can be configured to control a plurality of second transistors (e.g., WL select 312) of the memory circuit 100.

Corresponding to operation 2006 of FIG. 20, when writing/programming a memory cell 103 of the memory circuit 100, the first gate control signal can be configured to be equal to a fraction of the first supply voltage and the second control signal can be configured to be equal to the fraction of the first supply voltage. For example in FIG. 3, the first gate control signal NCGATE 350 can be configured to be equal to about 0.9V, which is about ½ of the supply voltage VQPS (e.g., about 1.8V). The second control signal PCGATE 352 can be configured to be equal to about 0.9V, which is about ½ of the supply voltage VQPS (e.g., about 1.8V). In various embodiments, such a fractional voltage half VQPS can allow each of transistors in FIGS. 1, 3, and 5 to operate under a relatively low voltage stress, e.g., under 0.96V. As such, each of the transistors, regardless of being implemented as NMOS or PMOS, can be implemented as a core device with a relatively thin gate dielectric while being immune from high voltage stress.

Corresponding to operation 2006 of FIG. 20, when reading the memory cell 103 of the memory circuit 100, the first gate control signal can be configured to be equal to the fraction of the first supply voltage and the second control signal can be configured to be equal to a third supply voltage lower than any of the first or second supply voltage. For example in FIG. 4, the first gate control signal NCGATE 350 can be configured to be equal to about 0.75V, which is about a fraction of the supply voltage VQPS (e.g., about 1.8V). The second control signal PCGATE 352 can be configured to be equal to about 0V, which is lower than any of the first or second supply voltage. In various embodiments, such a fractional voltage can allow each of transistors in FIGS. 1 and 4 to operate under a relatively low voltage stress, e.g., under 0.96V. As such, each of the transistors, regardless of being implemented as NMOS or PMOS, can be implemented as a core device with a relatively thin gate dielectric while being immune from high voltage stress.

In some embodiments, the core device of the present disclosure involves utilizing a nano-sheet (GAA) process, which offers several benefits. The present disclosure effectively addresses challenges related to gate oxide thickness control in GAA, primarily due to the absence of an IO device in this process. Stacking structures become essential in memory design to mitigate leakage issues, a problem exacerbated by the GAA process. Additionally, the core device of the present disclosure is suitable for high voltage and high current applications, necessitating stacking designs, including components like eFuse, anti-fuse, MRAM, and RRAM. Furthermore, the core device of the present disclosure is versatile and can be applied to various other processes, such as FinFET, fork-nanosheet, planner, and CFET. It also encompasses a range of transistor features, including horizontal, vertical, and LDMOS configurations, making it adaptable to diverse technological contexts.

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
a memory array comprising a plurality of memory cells;
an input/output (I/O) circuit operatively coupled to the memory array and configured to read or write each of the memory cells, wherein the I/O circuit comprises a plurality of second transistors, wherein the plurality of second transistors include a plurality of subsets of p-type transistors and a plurality of subsets of n-type transistors, and wherein each of the subsets of p-type transistors are coupled to one another in series and each of the subsets of n-type transistors are coupled to one another in series; and
a power management circuit operatively coupled to the memory array and the I/O circuit, and configured to provide a first gate control signal and a second gate control signal based on a received first supply voltage and a received second supply voltage, wherein the first supply voltage is substantially higher than two times the second supply voltage;
wherein the first gate control signal is equal to a first fraction of the first supply voltage and the second gate control signal is equal to the first fraction of the first supply voltage when at least one of the memory cells is being written, and wherein the first gate control signal is equal to the first fraction of the second supply voltage and the second gate control signal is equal to a third supply voltage lower than any of the first or second supply voltage when at least one of the memory cells is being read.

2. The memory circuit of claim 1, wherein the memory cells each include an efuse memory cell.

3. The memory circuit of claim 1, wherein the first fraction is about ½.

4. The memory circuit of claim 1, wherein the I/O circuit comprises:
a power switch comprising a plurality of first p-type transistors electrically stacked with respect to one another;
a bit line (BL) control circuit comprising a plurality of second p-type transistors electrically stacked with respect to one another;
a BL level shifter comprising a plurality of third p-type transistors electrically stacked with respect to one another;
a word line (WL) level shifter comprising a plurality of fourth p-type transistors electrically stacked with respect to one another; and
a plurality of sensing amplifiers each comprising a plurality of first n-type transistors.

5. The memory circuit of claim 4, wherein each of the memory cells includes a fuse resistor and a plurality of second n-type transistors coupled to each other in series, and wherein the plurality of second n-type transistors are electrically stacked with respect to one another.

6. The memory circuit of claim 5, wherein, regardless of the memory cells being read or written, a voltage across any two terminal of each of the first p-type transistors, second p-type transistors, third p-type transistors, fourth p-type transistors, first n-type transistors, and second n-type transistors is equal to or less than the first fraction of the first supply voltage.

7. The memory circuit of claim 6, wherein the first gate control signal is configured to gate at least one of the first n-type transistors and at least one of the second n-type transistors, and the second gate control signal is configured to gate at least one of the first p-type transistors, at least one of the second p-type transistors, at least one of the third p-type transistors, and at least one of the fourth p-type transistors.

8. The memory circuit of claim 5, wherein, regardless of the memory cells being read or written, a voltage across any two terminal of each of the first p-type transistors, second p-type transistors, third p-type transistors, and first n-type transistors is equal to or less than the first fraction of the first supply voltage, and voltage across any two terminals of each of the n-type transistors and fourth p-type transistors is equal to or less than a second fraction of the first supply voltage, and wherein the second fraction is greater than the first fraction.

9. The memory circuit of claim 8, wherein the first gate control signal is configured to gate at least one of the first n-type transistors and at least one of the second n-type transistors, and the second gate control signal is configured to gate at least one of the first p-type transistors, at least one of the second p-type transistors, at least one of the third p-type transistors, and at least one of the fourth p-type transistors.

10. The memory circuit of claim 4, wherein the BL level shifter is configured to shift a first voltage domain to a second voltage domain for the BL control circuit, the first voltage domain ranging from the third supply voltage to the second supply voltage, the second voltage domain ranging from the first fraction of the first supply voltage to the first supply voltage.

11. The memory circuit of claim 4, wherein the WL level shifter is configured to shift a first voltage domain to a second voltage domain for the memory cells, the first voltage domain ranging from the third supply voltage to the second supply voltage, the second voltage domain ranging from the third supply voltage to the first fraction of the first supply voltage or to a second fraction of the first supply voltage, the second fraction being greater than the first fraction.

12. A memory circuit, comprising:
a memory array comprising a plurality of memory cells coupled to a first supply voltage, each of the plurality of memory cells comprising a fuse resistor serially coupled to a plurality of first transistors;
an input/output (I/O) circuit coupled to a second supply voltage, comprising a plurality of second transistors, and configured to read or write each of the memory cells, wherein the plurality of second transistors include a plurality of subsets of p-type transistors and a plurality of subsets of n-type transistors, and wherein each of the subsets of p-type transistors are coupled to one another in series and each of the subsets of n-type transistors are coupled to one another in series; and
a power management circuit operatively coupled to both of the first supply voltage and the second supply voltage, comprising a plurality of third transistors, and configured to provide a first gate control signal and a second gate control signal based on the first supply voltage and the second supply voltage, wherein the first supply voltage is substantially higher than two times the second supply voltage;
wherein a voltage across any two terminal of each of the first transistors, second transistors, and third transistors is equal to or less than a fraction of the first supply voltage.

13. The memory circuit of claim 12, wherein the fraction is about ½.

14. The memory circuit of claim 12, wherein the memory cells each include a one-time-programmable (OTP) memory cell.

15. The memory circuit of claim 12, wherein the first gate control signal is equal to the fraction of the first supply voltage and the second gate control signal is equal to the first fraction of the first supply voltage when at least one of the memory cells is being written.

16. The memory circuit of claim 15, wherein the first gate control signal is equal to the first fraction of the first supply voltage and the second gate control signal is equal to a third supply voltage lower than any of the first or second supply voltage when at least one of the memory cells is being read.

17. The memory circuit of claim 12, wherein the plurality of first transistors of each memory cell have n-type conductivity and are coupled to one another in series.

18. A memory circuit, comprising:
a memory array;
an input/output (I/O) circuit operatively coupled to the memory array and configured to read or write the memory array, wherein the I/O circuit comprises a plurality of second transistors, wherein the plurality of second transistors include a plurality of subsets of p-type transistors and a plurality of subsets of n-type transistors, and wherein each of the subsets of p-type transistors are coupled to one another in series and each of the subsets of n-type transistors are coupled to one another in series; and
a power management circuit operatively coupled to the memory array and the I/O circuit, and configured to provide a first gate control signal and a second gate control signal based on a received first supply voltage and a received second supply voltage, wherein the first supply voltage is substantially higher than two times the second supply voltage;
wherein the first gate control signal is equal to a first fraction of the first supply voltage and the second gate control signal is equal to the first fraction of the first supply voltage when the memory array is being written, and wherein the first gate control signal is equal to the first fraction of the second supply voltage and the second gate control signal is equal to a third supply voltage lower than any of the first or second supply voltage when the memory array is being read.

19. The memory circuit of claim 18, wherein the first fraction is about ½.

20. The memory circuit of claim 18, wherein the I/O circuit comprises:
a power switch comprising a plurality of first p-type transistors electrically stacked with respect to one another;
a bit line (BL) control circuit comprising a plurality of second p-type transistors electrically stacked with respect to one another;
a BL level shifter comprising a plurality of third p-type transistors electrically stacked with respect to one another;
a word line (WL) level shifter comprising a plurality of fourth p-type transistors electrically stacked with respect to one another; and
a plurality of sensing amplifiers each comprising a plurality of first n-type transistors.

* * * * *